US011599782B2

(12) United States Patent
Shrivastava

(10) Patent No.: US 11,599,782 B2
(45) Date of Patent: Mar. 7, 2023

(54) SELF-POWERED ANALOG COMPUTING ARCHITECTURE WITH ENERGY MONITORING TO ENABLE MACHINE-LEARNING VISION AT THE EDGE

(71) Applicant: Northeastern University, Boston, MA (US)

(72) Inventor: Aatmesh Shrivastava, Boston, MA (US)

(73) Assignee: Northeastern University, Boston, MA (US)

( * ) Notice: Subject to any disclaimer, the term of this patent is extended or adjusted under 35 U.S.C. 154(b) by 441 days.

(21) Appl. No.: 16/829,774

(22) Filed: Mar. 25, 2020

(65) Prior Publication Data

US 2020/0311535 A1    Oct. 1, 2020

Related U.S. Application Data

(60) Provisional application No. 62/823,328, filed on Mar. 25, 2019.

(51) Int. Cl.
| | | |
|---|---|---|
| G06N 3/063 | (2006.01) | |
| H03F 3/45 | (2006.01) | |
| G06K 9/62 | (2022.01) | |
| G06N 3/08 | (2023.01) | |
| G06G 7/16 | (2006.01) | |
| G06N 3/04 | (2023.01) | |

(52) U.S. Cl.
CPC ............ *G06N 3/0635* (2013.01); *G06G 7/16* (2013.01); *G06K 9/6217* (2013.01); *G06K 9/6267* (2013.01); *G06N 3/04* (2013.01); *G06N 3/08* (2013.01); *H03F 3/4508* (2013.01); *H03F 3/45179* (2013.01)

(58) Field of Classification Search
CPC .......... G06N 3/0635; G06N 3/04; G06N 3/08; G06G 7/16; G06K 9/6217; G06K 9/6267; H03F 3/4508; G03F 3/45179
USPC ........................................................ 708/835
See application file for complete search history.

(56) References Cited

U.S. PATENT DOCUMENTS

| | | | | |
|---|---|---|---|---|
| 4,910,706 A | * | 3/1990 | Hyatt | G06J 1/00 365/45 |
| 11,402,826 B2 | * | 8/2022 | Cella | G06N 3/088 |

OTHER PUBLICATIONS

Bhadauria et al., "Sub-threshold, cascode compensated, bulk-driven OTAs with enhanced gain and phase-margin", Microelectronics Journal 54 (2016) 150-165 (Year: 2016).*

(Continued)

*Primary Examiner* — Tsu-Chang Lee
(74) *Attorney, Agent, or Firm* — Foley Hoag LLP; Dana M. Gordon; Erik A. Huestis

(57) ABSTRACT

An analog computing method includes the steps of: (a) generating a biasing current (IWi) using a constant gm bias circuit operating in the subthreshold region for ultra-low power consumption, wherein gm is generated by PMOS or NMOS transistors, the circuit including a switched capacitor resistor; and (b) multiplying the biasing current by an input voltage using a differential amplifier multiplication circuit to generate an analog voltage output (VOi). In one or more embodiments, the method is used in a vision application, where the biasing current represents a weight in a convolution filter and the input voltage represents a pixel voltage of an acquired image.

12 Claims, 15 Drawing Sheets

(56) References Cited

OTHER PUBLICATIONS

Kawaguchi et al., "Analog Learning Neural Circuit with Switched Capacitor and the Design of Deep Learning Model", Computational Science/Intelligence and Applied Informatics, Studies in Computational Intelligence 726, 2018 (Year: 2018).*
Kim et al., "Analog CMOS-based Resistive Processing Unit for Deep Neural Netwok Training", 2017 IEEE International Midwest Symposium on Circuits and Systems, Aug. 6-9, 2017 (Year: 2017).*
"NSF Industry-University Cooperation Center—Center for Hardware and Embedded Systems Security and Trust (CHEST)," https://nsfchest.org.
Abdelfattah et al., "A chopper instrumentation amplifier with fully symmetric negative capacitance generation feedback loop and online digital calibration for input impedance boosting," in 2019 IEEE Midwest Symposium on Circuits and Systems (MWSCAS), pp. 1-4 (2019).
Agarwal et al., "A pvt independent subthreshold constant—gm stage for very low frequency applications," In 2008 IEEE International Symposium on Circuits and Systems, pp. 2909-2912 (2008).
Amaravati et al., "A fully on-chip ptinvariant transconductor," IEEE Transactions on Very Large Scale Integration (VLSI) Systems, 23(9):1961-1964 (2015).
Ambrogio et al., "Equivalent-accuracy accelerated neural-network training using analogue memory," Nature, 558(7708):60-67 (2018).
Antao et al., "A 9-nw on-chip constant subthreshold cmos transconductance bias with fine-tuning," In 2017 IEEE International Symposium on Circuits and Systems (ISCAS), pp. 1-4 (2017).
Arya et al., "Gm-c biquad filter for low signal sensor applications," In 2016 MIXDES—23rd International Conference Mixed Design of Integrated Circuits and Systems, pp. 207-210 (2016).
Badin et al., "Evaluation of evs energy consumption influencing factors, driving conditions, auxiliaries use, driver's aggressiveness," in 2013 World Electric Vehicle Symposium and Exhibition (EVS27), pp. 1-12 (2013).
Bankman et al., "An always-on 3.8 µj/86% cifar-10 mixed-signal binary cnn processor with all memory on chip in 28nm cmos," in 2018 IEEE International Solid-State Circuits Conference—(ISSCC), pp. 222-224 (2018).
Beckmann et al., "Nanoscale hafnium oxide rram devices exhibit pulse dependent behavior and multi-level resistance capability," MRS Advances, 1(49):3355-3360 (2016).
Binkert et al., "The gem5 simulator," SIGARCH Comput. Archit. News, 39(2):1-7 (2011).
Bojarski et al., "End to end learning for self-driving cars," (2016).
Calhoun et al., "Modeling and sizing for minimum energy operation in subthreshold circuits," IEEE Journal of Solid-State Circuits, 40(9):1778-1786 (2005).
Chen et al., "Data mining for the online retail industry: A case study of rfm model-based customer segmentation using data mining," Journal of Database Marketing & Customer Strategy Management, 19(3):197-208 (2012).
Chen et al., "Novel constant transconductance references and the comparisons with the traditional approach," Southwest Symposium on Mixed-Signal Design, pp. 104-107 (2003).
Chu et al., "A pvt-independent constant—gm bias technique based on analog computation," IEEE Transactions on Circuits and Systems II: Express Briefs, 61(10):768-772 (2014).
Cong et al., "Parade: A cycle-accurate full-system simulation platform for accelerator-rich architectural design and exploration," in 2015 IEEE/ACM International Conference on Computer-Aided Design (ICCAD), pp. 380-387 (2015).
Courbariaux et al., "Binaryconnect: Training deep neural networks with binary weights during propagations," in Advances in Neural Information Processing Systems 28, C. Cortes, N. D. Lawrence, D. D. Lee, M. Sugiyama, and R. Garnett, Eds. Curran Associates, Inc., pp. 3123-3131 (2015).
Cowan et al., "A vlsi analog computer/digital computer accelerator," IEEE Journal of Solid-State Circuits, 41(1):42-53 (2006).
Cowan et al., "A vlsi analog computer/math co-processor for a digital computer," in ISSCC. 2005 IEEE International Digest of Technical Papers. Solid-State Circuits Conference, 1:82-586 (2005).
Dreslinski et al., "Nearthreshold computing: Reclaiming moore's law through energy efficient integrated circuits," Proceedings of the IEEE, 98(2):253-266 (2010).
El-Hassan et al., "Modelling of wire resistance effect in pcm-based nanocrossbar memory," The Journal of Engineering, 2016(10):357-362 (2016).
Enz et al., "Circuit techniques for reducing the effects of op-amp imperfections: autozeroing, correlated double sampling, and chopper stabilization," Proceedings ofthe IEEE, 84(11):1584-1614 (1996).
Farabet et al., "An fpga-based stream processor for embedded real-time vision with convolutional networks," in 2009 IEEE 12th International Conference on Computer Vision Workshops, ICCV Workshops, pp. 878-885 (2009).
Girshick et al., "Rich feature hierarchies for accurate object detection and semantic segmentation," in Proceedings of the 2014 IEEE Conference on Computer Vision and Pattern Recognition, ser. CVPR '14. Washington, DC, USA: IEEE Computer Society pp. 580-587 (2014).
Girshick, "Fast R-CNN," CoRR, vol. abs/1504.08083 (2015).
Goodfellow et al., "Generative adversarial nets," in Advances in Neural Information Processing Systems 27, Z. Ghahramani, M. Welling, C. Cortes, N. D. Lawrence, and K. Q. Weinberger, Eds. Curran Associates, Inc., pp. 2672-2680 (2014).
Gregoire et al., "A sub 1-v constant gm ndash; c switched-capacitor current source," IEEE Transactions on Circuits and Systems II: Express Briefs, 54(3):222-226 (2007).
Guo et al., "Energy-efficient hybrid analog/digital approximate computation in continuous time," IEEE Journal of Solid-State Circuits, 51(7):1514-1524 (2016).
Hahnle et al., "Fpga-based real-time pedestrian detection on high-resolution images," in The IEEE Conference on Computer Vision and Pattern Recognition (CVPR) Workshops (2013).
He et al., "Customized binary and multilevel hfo2x-based memristors tuned by oxidation conditions," Scientific Reports, 7(1):10070 (2017).
He et al., "Deep residual learning for image recognition," CoRR, vol. abs/1512.03385 (2015).
Hennessy et al., "Computer Architecture, Fifth Edition: A Quantitative Approach," 5th ed. San Francisco, CA, USA: Morgan Kaufmann Publishers Inc. (2011).
Huang et al., ""Evaluation of an analog accelerator for linear algebra,"" in 2016 ACM/IEEE 43rd Annual International Symposium on Computer Architecture (ISCA), pp. 570-582 (2016).
Huang et al., "Hybrid analog-digital solution of nonlinear partial differential equations," in Proceedings of the 50th Annual IEEE/ACM International Symposium on Microarchitecture, ser. MICRO-50 '17. New York, NY, USA: ACM, pp. 665-678 (2017).
Huang et al., "Yolo-lite: A real-time object detection algorithm optimized for non-gpu computers," 2018 IEEE International Conference on Big Data (Big Data) (2018).
Jaderberg et al., "Spatial transformer networks," in Advances in Neural Information Processing Systems 28, C. Cortes, N. D. Lawrence, D. D. Lee, M. Sugiyama, and R. Garnett, Eds. Curran Associates, Inc., pp. 2017-2025 (2015).
Jansen et al., "Complementary constant—gm biasing of nauta-transconductors in low-power gm x2013;c filters to x00b1;2," IEEE Journal of SolidState Circuits, 48(7):1585-1594 (2013).
Jeng, "Design and Modeling of Deep-Submicrometer MOSFETs," PhD thesis, University of California (1989).
Jouppi et al., "Indatacenter performance analysis of a tensor processing unit," in 2017 ACM/IEEE 44th Annual International Symposium on Computer Architecture (ISCA), pp. 1-12 (2017).
Karpathy et al., "Deep visual-semantic alignments for generating image descriptions," IEEE Transactions on Pattern Analysis and Machine Intelligence, 39(4):664-676 (2017).
Kingra et al., "Methodology for Realizing VMM with Binary RRAM Arrays: Experimental Demonstration of Binarized-ADALINE Using OxRAM Crossbar," Conference paper at ISCAS (2020).

(56) References Cited

OTHER PUBLICATIONS

Klinefelter et al., "A 6.45 μw self-powered iot soc with integrated energy-harvesting power management and ulp asymmetric radios," in 2015 IEEE International Solid-State Circuits Conference—(ISSCC) Digest of Technical Papers, pp. 1-3 (2015).

Krizhevsky et al., "Imagenet classification with deep convolutional neural networks," in Advances in Neural Information Processing Systems 25, F. Pereira, C. J. C. Burges, L. Bottou, and K. Q. Weinberger, Eds. Curran Associates, Inc., pp. 1097-1105 (2012).

LeCun, "1.1 deep learning hardware: Past, present, and future," in 2019 IEEE International Solid-State Circuits Conference—(ISSCC), pp. 12-19 (2019).

Lee et al., "24.2 a 2.5ghz 7.7tops/w switched-capacitor matrix multiplier with co-designed local memory in 40nm," in 2016 IEEE International SolidState Circuits Conference (ISSCC), pp. 418-419 (2016).

Lee et al., "Analysis and design of a passive switched-capacitor matrix multiplier for approximate computing," IEEE Journal of Solid-State Circuits, 52(1):261-271 (2017).

Li et al., "Analogue signal and image processing with large memristor crossbars," Nature Electronics, 1:52-59 (2017).

LiKamWa et al., "Redeye: Analog convnet image sensor architecture for continuous mobile vision," in 2016 ACM/IEEE 43rd Annual International Symposium on Computer Architecture (ISCA), pp. 255-266 (2016).

Lim et al., "Performance comparison of mim capacitors and metal finger capacitors for analog and rf applications," In 2004 RF and Microwave Conference (IEEE Cat. No. 04EX924), pp. 85-89 (2004).

Lin et al., "The architectural implications of autonomous driving: Constraints and acceleration," SIGPLAN Not., 53(2):751-766 (2018).

Lindholm et al., "Nvidia tesla: A unified graphics and computing architecture," IEEE Micro, 28(2):39-55 (2008).

Lu et al., "A 1 tops/w analog deep machine-learning engine with floating-gate storage in 0.13 m cmos," IEEE Journal of Solid-State Circuits, 50(1):270-281 (2015).

Lu et al., "Combined central and subspace clustering for computer vision applications," in Proceedings of the 23rd International Conference on Machine Learning, ser. ICML '06. New York, NY, USA: ACM, pp. 593-600 (2006).

Manem et al., "A read-monitored write circuit for ltlm multi-level memristor memories," in 2011 IEEE International Symposium of Circuits and Systems (ISCAS), pp. 2938-2941 (2011).

McLaren et al., "Generation of accurate on-chip time constants and stable transconductances," IEEE Journal of Solid-State Circuits, 36(4):691-695 (2001).

Mirchandani et al., "CMOS based ultra-low power high-precision analog vector matrix multiplication circuit with 0.1% error for vision application," in 2019 IEEE Midwest Symposium on Circuits and Systems (MWSCAS), pp. 1-4 (2019).

Mirchandani et al., "High stability gain structure and filter realization with less than 50 ppm/oc temperature variation with ultra-low power consumption using switched-capacitor and sub-threshold biasing," in 2018 IEEE International Symposium on Circuits and Systems (ISCAS), pp. 1-4 (2018).

Miyashita et al., "A neuromorphic chip optimized for deep learning and cmos technology with time-domain analog and digital mixed-signal processing," IEEE Journal of Solid-State Circuits, 52(10):2679-2689 (2017).

Mondal et al., "Accurate constant transconductance generation without off-chip components," In 2015 28th International Conference on VLSI Design, pp. 249-253 (2015).

Ng et al., "Medical image segmentation using k-means clustering and improved watershed algorithm," in 2006 IEEE Southwest Symposium on Image Analysis and Interpretation, pp. 61-65 (2006).

Nicolson et al., "Improvements in biasing and compensation of cmos opamps," In 2004 IEEE International Symposium on Circuits and Systems (IEEE Cat. No. 04CH37512), 1:665-668 (2004).

Nikolaos et al., "A novel way to efficiently simulate complex full systems incorporating hardware accelerators," in Proceedings of the Conference on Design, Automation & Test in Europe, ser. Date '17. 3001 Leuven, Belgium, Belgium: European Design and Automation Association, pp. 658-661 (2017).

Park et al., "A 646gops/w multi-classifier many-core processor with cortex-like architecture for superresolution recognition," in 2013 IEEE International Solid-State Circuits Conference Digest of Technical Papers, pp. 168-169 (2013).

Pavan, "A fixed transconductance bias technique for cmos analog integrated circuits," In 2004 IEEE International Symposium on Circuits and Systems (IEEE Cat. No. 04CH37512) 1:661-664 (2004).

Potter et al., "Detecting meaning in rsvp at 13 ms per picture," Attention, Perception, & Psychophysics, 76(2):270-279 (2014).

Razavi,. "Design of Analog CMOS Integrated Circuits," McGraw-Hill, first edition (2001).

Redmon et al., "You only look once: Unified, real-time object detection," 2016 IEEE Conference on Computer Vision and Pattern Recognition (CVPR) (2016).

Ren et al., "Faster r-cnn: Towards real-time object detection with region proposal networks," in Advances in Neural Information Processing Systems 28, C. Cortes, N. D. Lawrence, D. D. Lee, M. Sugiyama, and R. Garnett, Eds. Curran Associates, Inc., pp. 91-99 (2015).

Roberts et al., "26.8 a 236nw-56.5dbm-sensitivity bluetooth low-energy wakeup receiver with energy harvesting in 65nm cmos," in 2016 IEEE International SolidState Circuits Conference (ISSCC), pp. 450-451 (2016).

Serrano et al., "A precision low-tc wide-range cmos current reference," IEEE Journal of Solid-State Circuits, 43(2):558-565 (2008).

Shafiee et al., "Isaac: A convolutional neural network accelerator with in-situ analog arithmetic in crossbars," in 2016 ACM/IEEE 43rd Annual International Symposium on Computer Architecture (ISCA), pp. 14-26 (2016).

Shao et al., "Co-designing accelerators and soc interfaces using gem5-aladdin," in 2016 49th Annual IEEE/ACM International Symposium on Microarchitecture (MICRO), pp. 1-12 (2016).

Shen et al., "Constant-gm bias circuit without off-chip components," In 2016 13th IEEE International Conference on Solid-State and Integrated Circuit Technology (ICSICT), pp. 1309-1311 (2016).

Shi et al., "Edge computing: Vision and challenges," IEEE Internet of Things Journal, 3(5):637-646 (2016).

Shrivastava et al., "5.4 a 32nw bandgap reference voltage operational from 0.5v supply for ultra-low power systems," in 2015 IEEE International Solid-State Circuits Conference—(ISSCC) Digest of Technical Papers, pp. 1-3 (2015).

Shrivastava et al., "A 1.5 nw, 32.768 khz xtal oscillator operational from a 0.3 v supply," IEEE Journal of Solid-State Circuits, 51(3):686-696 (2016).

Shrivastava et al., "A 10mv-input boost converter with inductor peak current control and zero detection for thermoelectric energy harvesting," in Proceedings ofthe IEEE 2014 Custom Integrated Circuits Conference, pp. 1-4 (2014).

Shrivastava et al., "A charge pump based receiver circuit for voltage scaled interconnect," in Proceedings of the 2012 ACM/IEEE International Symposium on Low Power Electronics and Design, ser. ISLPED '12. New York, NY, USA: ACM, pp. 327-332 (2012).

Simonyan et al., "Very deep convolutional networks for large-scale image recognition," CoRR, vol. abs/1409.1556 (2014).

Steininger, "Understanding wide-band mos transistors," IEEE Circuits and Devices Magazine, 6(3):26-31 (1990).

Strukov et al., "The missing memristor found," Nature, 453:80-83 (2008).

Szegedy et al., "Going deeper with convolutions," CoRR, vol. abs/1409.4842 (2014).

Talebbeydokhti et al., "Constant transconductance bias circuit with an on-chip resistor," 2006 IEEE International Symposium on Circuits and Systems, pp. 2857-2860 (2006).

Vietze et al., "Image sensing with programmable offset pixels for increased dynamic range of more than 150 db," Proc. of SPIE, 2654:2654-2656 (1996).

Wu et al., "Multiplication on the edge," Nature Electronics, 1:8-9 (2018).

(56) References Cited

OTHER PUBLICATIONS

Yu et al., "A high-density mim capacitor (13 ff/m2) using aid hfo2dielectrics," IEEE Electron Device Letters, 24(2):63-65 (2003).
Zeiler et al., "Visualizing and understanding convolutional networks," CoRR, vol. abs/1311.2901 (2013).
Zele et al., "Low-power cmos continuous-time filters," IEEE Journal of Solid-State Circuits, 31(2):157-168 (1996).
Zhang et al., "18.4 a matrix-multiplying adc implementing a machine-learning classifier directly with data conversion," in 2015 IEEE International Solid-State Circuits Conference—(ISSCC) Digest of Technical Papers, pp. 1-3 (2015).
Zhang et al., "A batteryless 19 mw mics/ism-band energy harvesting body sensor node soc for exg applications," IEEE Journal of Solid-State Circuits, 48(1):199-213 (2013).

* cited by examiner

SELF-POWERED ANALOG COMPUTING ARCHITECTURE WITH ENERGY MONITORING TO ENABLE MACHINE-LEARNING VISION AT THE EDGE

CROSS REFERENCE TO RELATED APPLICATION

This application claims priority from U.S. Provisional Patent Application No. 62/823,328 filed on Mar. 25, 2019 and entitled SELF-POWERED ANALOG COMPUTING ARCHITECTURE WITH ENERGY MONITORING TO ENABLE MACHINE-LEARNING VISION AT THE EDGE, which is hereby incorporated by reference.

BACKGROUND

The internet-of-things (IoT) is the way in which networking sensors are placed on everyday physical objects to perform meaningful sensing and communication. Since its conception, IoT has been touted as the next wave of computing with exponential growth prospects. However, the growth outlook of IoT has recently been tempered due to the technological challenges that still need to be overcome. IoT devices should be seamlessly deployed in our environment without the need for maintenance, such as through a battery-less device that runs on harvested energy. However, harvested energy is low and system power consumption is high. Further, there is a need to enable edge-computing to reduce the amount of data and associated traffic. Edge-computing incorporates processing abilities inside the edge-device, and provides a way for an efficient use of energy and spectrum [1-3]. Furthermore, IoT edge-devices have to address modern computing needs of machine-learning and deep-learning to have a dedicated computing infrastructure for even higher power gains [4, 5].

Power efficiency and effective use of available spectrum by IoT devices are two core issues around which IoT networks are being developed. A recent report from McKinsey Inc. identifies self-powered operation of IoT devices as the key challenge that needs to be overcome to realize the full potential and growth of IoT [6]. To that end, researchers have been developing ultra-low power (ULP) and energy harvesting circuit and system design techniques. A typical approach is to make more energy available for the system through efficient and ULP energy harvesting while also reducing the power consumption of existing circuits and system architecture to overcome the energy gap [7]. The latest ULP design techniques are leading to an overhaul of existing circuit and system architectures. The disclosure herein relates to self-powered IoT devices that can implement vision. Techniques disclosed herein relate to a new machine-learning, application specific integrated circuit (ASIC) that has a high precision and reconfigurable analog computing infrastructure to realize several orders of magnitude improvement in power efficiency. The disclosure also relates to an energy-monitoring system (EMS) to scale system operation based on available energy to achieve infinite lifetime.

Computer vision involves extracting meaningful information from images or videos. Its usage can be found in variety of real world applications such as automatic inspection, identification, control based on incoming videos or images (e.g., self-driving cars and robots), feature-extraction, and human-machine interactions among others. Ever since the overwhelming victory of deep convolutional neural-network (CNN) for image classification at the Imagenet challenge [8], CNN based deep-learning and machine learning algorithms have gained popularity in vision applications [9-18]. These CNN algorithms achieved much higher accuracy for image classification and evolved into more deeper and involved networks. However, the hardware resource requirement for running these algorithms is significantly high. Some of the hardware that can efficiently execute these networks are Intel's Haswell with a CPU architecture [19], Nvidia's Tesla-K80 with a GPU architecture [20], and Google's Tensor Processing Unit (TPU) which is a neural-network based ASIC [21]. The thermal design power (TDP) for Haswell is 145 W, for Nvidia's K-80 is 150 W, and 75 W for Google's TPU. The peak power is often 1.5× larger than the TDP [22], and above designs are power constrained from thermal point of view (POV) and not from lifetime POV. The energy constrained devices that reside at the edge of IoT needs to have power consumption at pW and nW level such as system-on-chips (SoC) [7, 23-26]. A gap of 8-9 orders of magnitude exists between the power consumption needed for running CNNs and power available at the edge. Device scaling is unlikely to reduce this power gap by a significant amount as CMOS scaling is expected to end by 2024 [27]. There is a need to develop dedicated hardware, such as ASICs where hardware and algorithms are developed in communion [28]. Embodiments disclosed herein relate to an analog computing infrastructure for vision applications operating in an energy constrained environment.

Analog Hardware for Machine-Learning

Analog computing has been known to be highly efficient in terms of both area and power for realizing a given function on the chip. Compared to digital computing, where transistors are operated at two extreme operating states (on and off), analog computing can make use of the entire range of the operating current and voltage of a transistor, incorporating a vast amount of information per transistor with high power efficiency. These features of analog computing have become highly appealing to the modern computing needs where higher area and/or higher energy efficiency is needed, such as for the implementation of machine learning, deep learning, computation at the edge for IoT applications. However, analog computing has traditionally suffered from issues such as reliability, programmability, long design time, power consumption, and high susceptibility to variations, which led to a swift rise of digital computing. The spread of digital computing was significantly aided by CMOS technology scaling, as more and more transistors can be added on the silicon to scale up the computational power per-unit area. However, CMOS scaling is expected to end by 2024 [27], and adding more compute capability by way of technology scaling is no longer as trivial as it used to be.

The classical advantages of analog computing have again started to appear in recently published works. Advantages of analog computing in implementing hardware to solve partial and ordinary differential equations (PDE and ODE) have been reported in recent publications [29-32]. A recent paper at MICRO uses an analog accelerator to implement a PDE solver, and achieved 5.7× performance improvement and over 11.6× reduction in power consumption [33]. Analog computing is considered particularly promising for implementing machine-learning algorithm as it can significantly reduce the amount of hardware needed for complex networks [34-38]. In [37], authors implemented a deep learning hardware using analog computing elements to achieve a significantly higher power and area efficiency when compared to a similar hardware implemented using digital hardware [36]. Memristor based analog computing designs that can implement image processing networks have also been reported recently [39, 40]. A simulation based analog computing implementation of first five stages of GoogleNet has also been reported to showcase power and area benefits of analog [41].

BRIEF SUMMARY OF THE DISCLOSURE

An analog computing method in accordance with one or more embodiments includes the steps of: (a) generating a biasing current (IWi) using a constant gm bias circuit operating in the subthreshold region for ultra-low power consumption, wherein gm is generated by PMOS or NMOS transistors, the circuit including a switched capacitor resistor; and (b) multiplying the biasing current by an input voltage using a differential amplifier multiplication circuit to generate an analog voltage output (VOi). In one or more embodiments, the method is used in a vision application, where the biasing current represents a weight in a convolution filter and the input voltage represents a pixel voltage of an acquired image.

An analog computing circuit in accordance with one or more embodiments is also disclosed herein. The analog computing circuit includes a constant gm bias circuit operating in the subthreshold region for ultra-low power consumption for generating a biasing current (IWi), wherein gm in the constant gm bias circuit is generated by PMOS or NMOS transistors. The constant gm bias circuit includes a switched capacitor resistor. The analog computing circuit also includes a differential amplifier multiplication circuit coupled to the constant gm bias circuit for receiving the biasing current and an input voltage and multiplying the biasing current by the input voltage to generate an analog voltage output (VOi).

DETAILED DESCRIPTION

One or more embodiments disclosed herein relate to an analog processing vision ASIC with several orders of magnitude higher power efficiency. A more general and precise analog processing architecture that can be utilized for many deep learning networks will be developed. A highly stable, sub-threshold based analog computing platform can reduce the power consumption, thanks to sub-threshold operation, and reduce the variation in analog computation by three orders of magnitude, providing high precision circuit elements.

Precision Analog Circuit Elements

Disclosed herein are high precision analog circuit components that is used for analog computing elements machine-learning vision ASIC. The architecture operates device in sub-threshold region. Sub-threshold biasing is used to realize the lowest power 32 KHz crystal oscillator circuit [42]. Sub-threshold operation of CMOS transistors can achieve extremely low power consumption and achieve highest power efficiencies [43, 44]. However, sub-threshold operation has long been associated with high variations of outputs due to process, temperature, or voltage variations. This deficiency of sub-threshold operation can be removed using constant gm analog circuits. In actuality, it is with sub-threshold device operation that one can achieve very precise outputs for various fundamental analog circuits, which is used for PDE solver. To achieve highly stable outputs, we utilize the transconductance gm of a device biased in sub-threshold that is very stable, a concept that was presented in 1970s by the early makers of electronics watch [45]. FIGS. 1A-1H show an example differential amplifier and a low-pass filter implemented with sub-threshold operation achieving high stability of 48 ppm/° C. simulated over a 120° C. temperature range.

Concept Behind Precision Analog Circuits

Figure 1A:
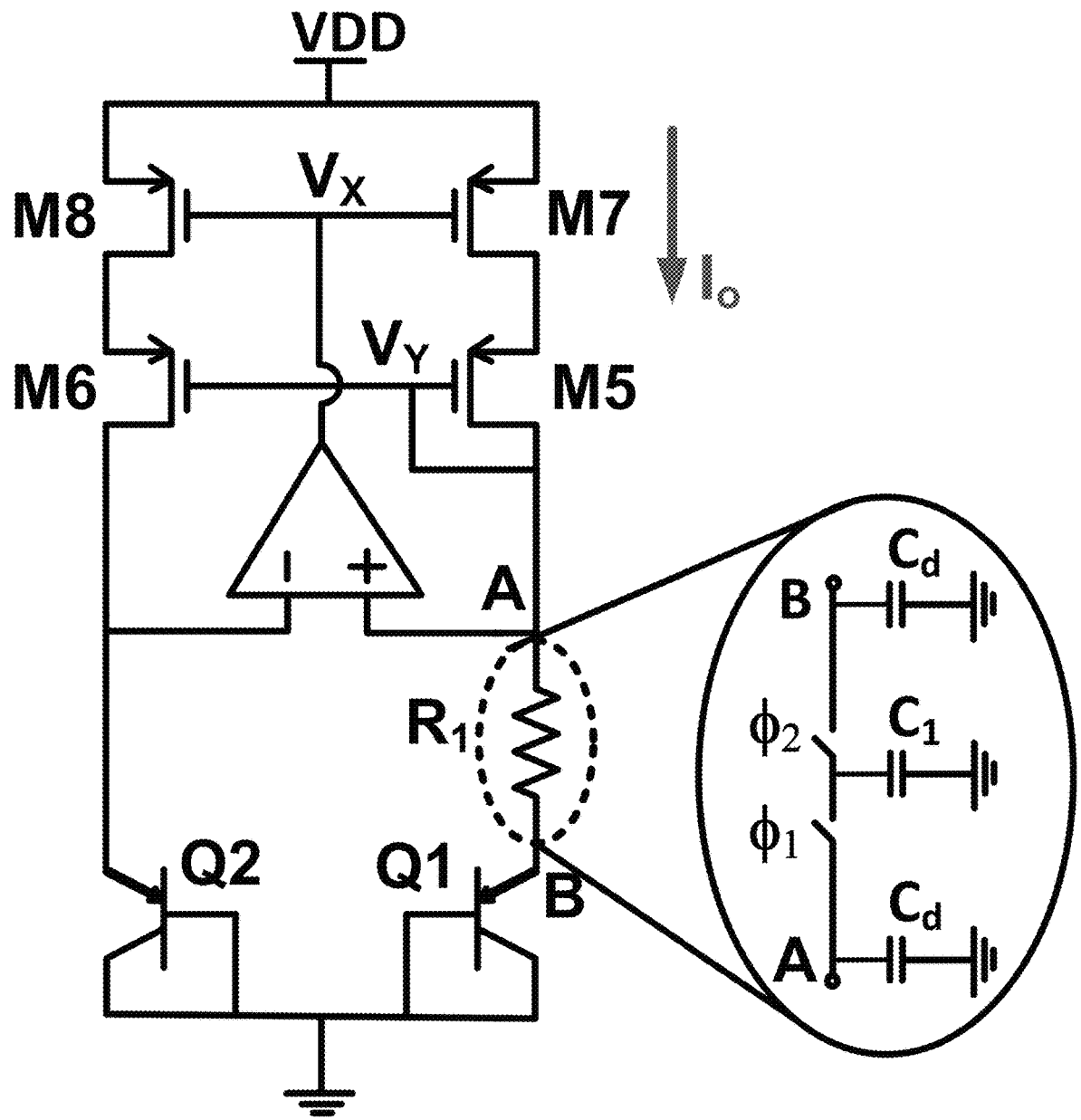
FIG. 1A shows an exemplary BJT-based current source for constant gm biasing.
Figure 1B:
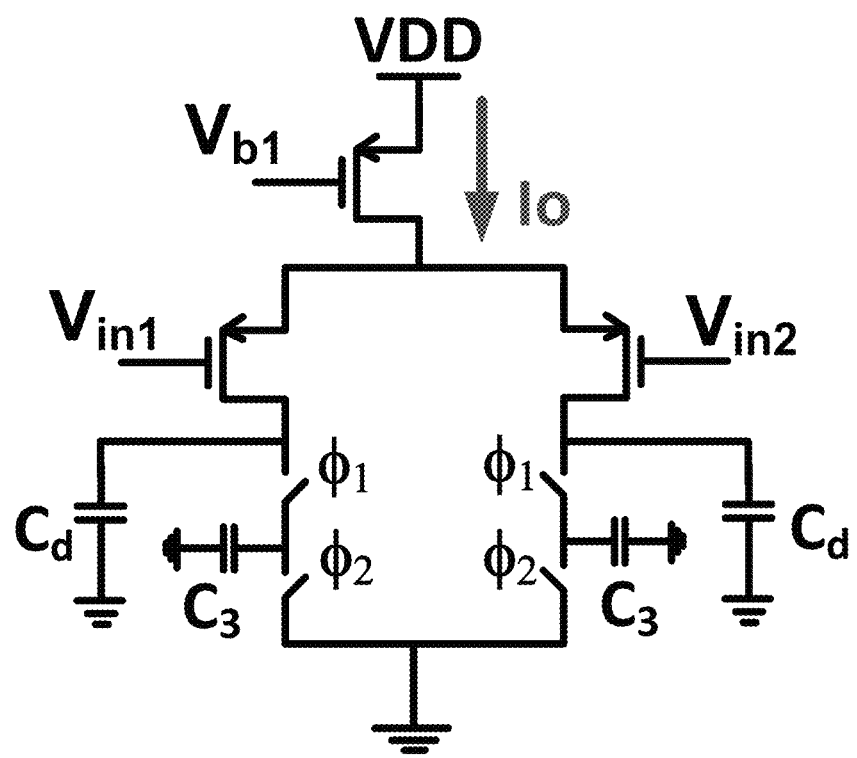
FIG. 1B shows an exemplary differential amplifier with an SCR and decoupling capacitors in accordance with one or more embodiments.
Figure 1C:
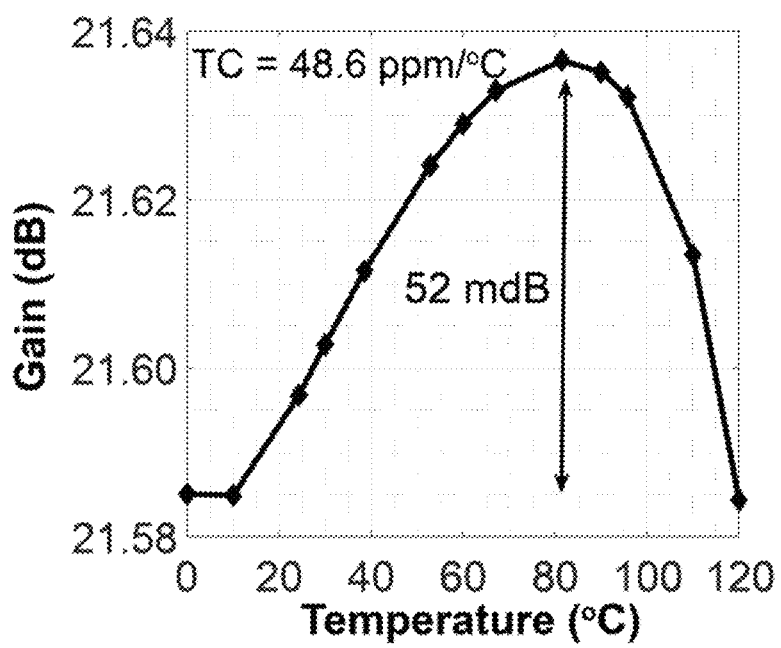
FIG. 1C shows differential amplifier gain variance with temperature.
Figure 1D:
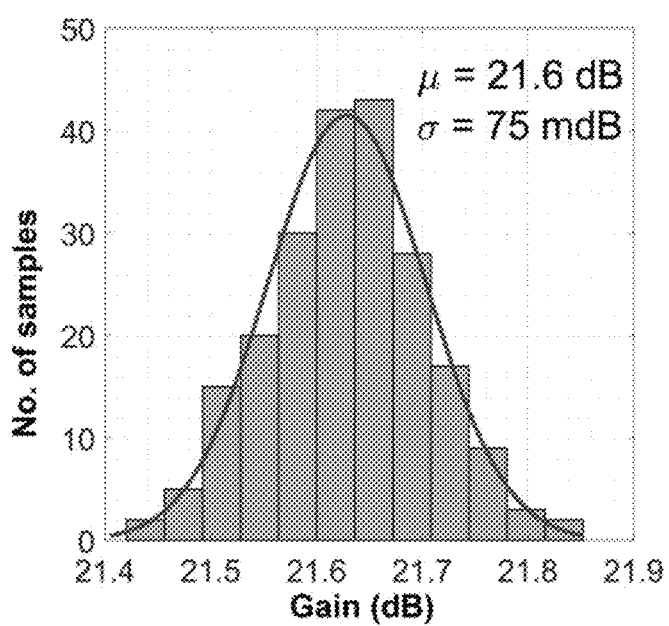
FIG. 1D shows process variation of differential amplifier gain at 50° C.
Figure 1E:
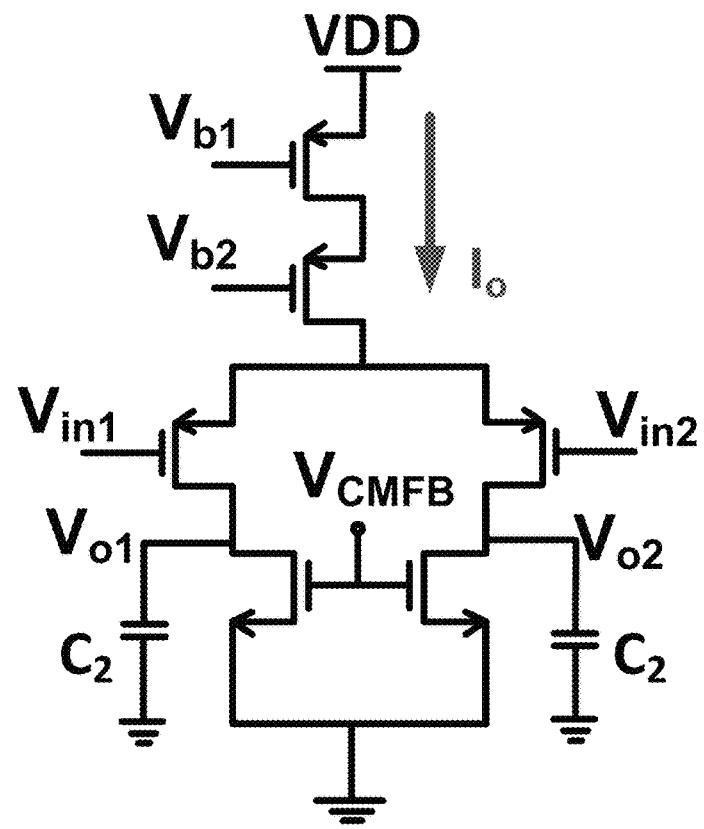
FIG. 1E shows an exemplary sub-threshold gm-C filter with PTAT bias in accordance with one or more embodiments.
Figure 1F:
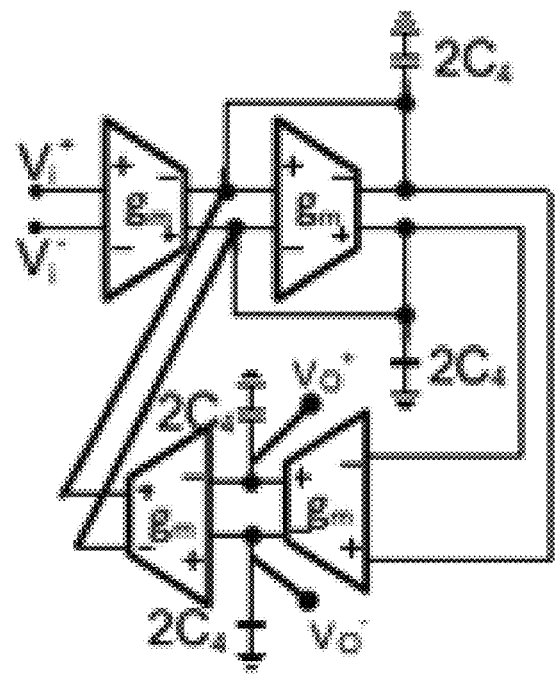
FIG. 1F shows an exemplary gm-C biquad filter in accordance with one or more embodiments.
Figure 1G:
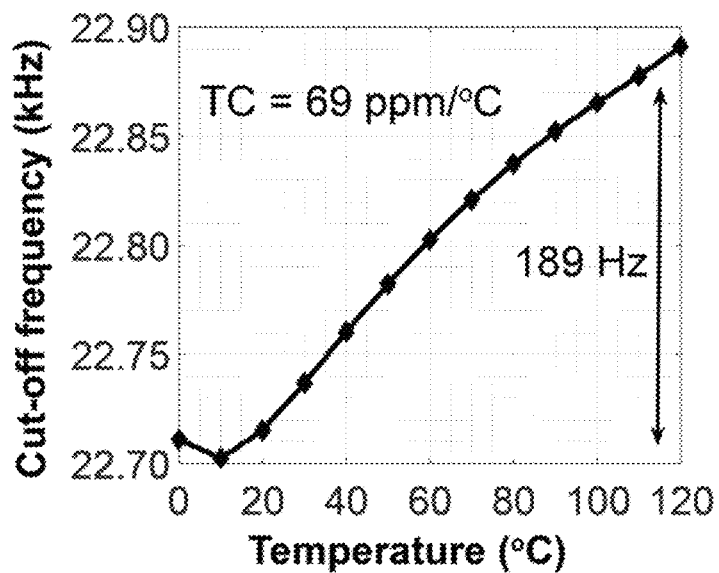
FIG. 1G shows variation of cut off frequency of a biquad LPF with temperature.
Figure 1H:
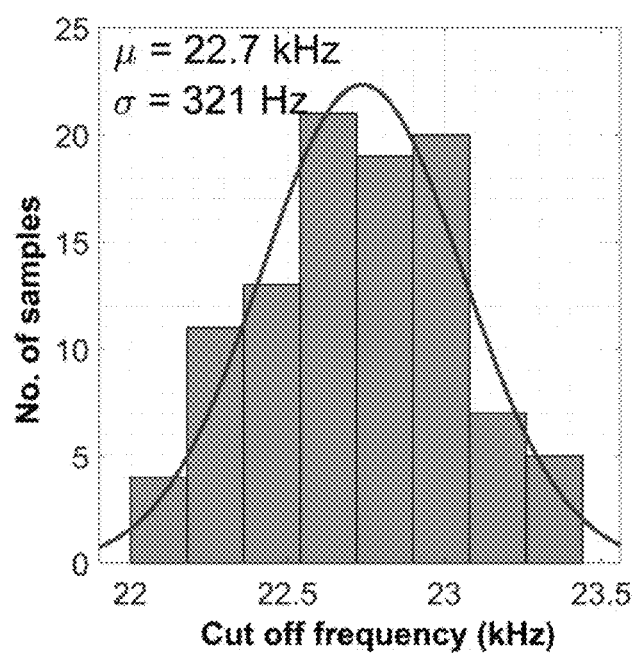
FIG. 1H shows process variation of cut off frequency of a biquad filter.

The transconductance, $g_m$, of a transistor biased in sub-threshold is given by $$g_m = \frac{I_O}{\eta V_t} \quad (1)$$

where $I_O$ is the bias current, $\eta$ is a process constant $V_t$ is the thermal voltage. Further, a proportional-to-absolute temperature (PTAT) current reference can be used to bias the transistor, realizing a constant $g_m$ circuit. FIG. 1A shows a conventional PTAT current reference circuit where IO is given by, $$I_O = \frac{V_t \ln M}{R_1} \quad (2)$$

We use equations 1 and 2 to realize the differential amplifier (diff-amp) shown with a $g_m$ obtained through PTAT bias and a resistive load $R_2$. The gain of this diff-amp can be expressed as $$A = g_m R_2 = \frac{\ln M}{\eta} \frac{R_2}{R_1} \quad (3)$$

The gain of the diff-amp in equation 3 is a constant, where the only process-dependent parameters are the values of resistors $R_1$ and $R_2$, but these are in a ratio that is reliable even with variations. However, for ULP operation both $R_1$ and $R_2$ have to be of very large value (over several megaohms), which can require very large area. In order to address this aspect, we can make use of switched-capacitor realizations of resistors (SCR), which is illustrated in FIG. 1A. The PTAT current source can be realized by replacing the resistor $R_1$ through an (SCR), and the gain of differential amplifier in this case is given by, $$A = \frac{\ln M}{\eta} \frac{C_1}{C_2} \quad (4)$$

Our preliminary analysis shows that the differential amplifier achieves a temperature stability of 48 ppm/° C. It exhibits a 3-$\sigma$ process variation of 2.3%. The gain of the differential amplifier achieved through this structure is very precise and does not vary with temperature and process. This work was recently published at International Symposium on Circuits and Systems (ISCAS) [46]. These circuits along with the underlying concept can be used to develop bigger analog macros such as multipliers, adders, and pooling-networks, to implement the analog computing system for vision.

Vision ASIC Architecture

The ImageNet challenge is a comprehensive image classification task that has led to several award winning CNN architectures [8-18]. However with each new architecture, the network has only grown deeper which needs more compute resources and power. AlexNet, for example, takes 6 days and GoogleNet takes 21 days to train on NVIDIA-K80 GPU [47] and involve several TFLOPs of computation. Certainly, these networks cannot be used for self-powered vision applications. In fact, it is difficult to realize a much simpler CNN network such as LeNet-5 [48] for character recognition in such power budgets using existing digital hardware. However, analog computing hardware can provide higher energy and area efficiency and should be able to implement simpler CNN at the edge. In this project, we propose to implement a modified LeNet-5 CNN for vision applications. We will use a lower complexity CIFAR-10 datasets which has 60K 32×32 images that can be put in 10 different classes. CIFAR-10 has also been used by other vision projects for IoT edge devices [37,49]. A CNN that can classify CIFAR-10 can be potentially used in applications where smaller classification set can exists such as remote-surveillance, navigation (particularly in industrial set-up), applications involving drones, among others.

Figure 2:
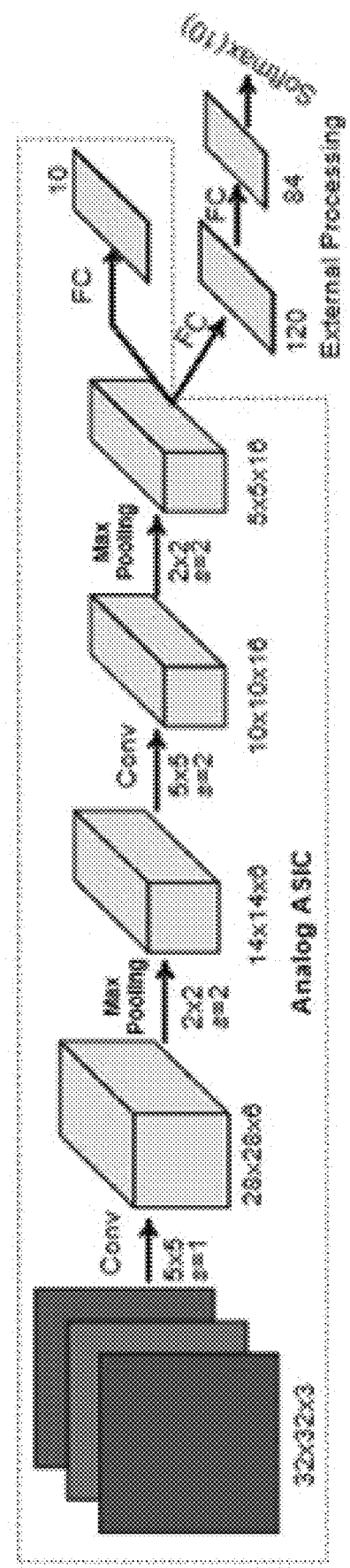
FIG. 2 shows an exemplary CNN architecture used for CIFAR-10 classification.

FIG. 2 shows the CNN architecture used for CIFAR-10 classification. This CNN architecture is a modified version of LeNet-5 commonly used for gray-scale character recognition [48]. The first stage will have 5×5 (×3) convolution stages. The convolution is carried out in analog with image pixel being represented as voltages and weights represented as currents. The output of the convolution is passed through a Rectified Linear Unit (ReLU) layer which will work as an activation function. This step is an addition over classical LeNet-5 architecture and takes advantage of ReLU nonlinearity for faster learning. An analog realization of ReLU, called A-ReLU will also be developed. Compared to a digital implementation of ReLU which is given as $f(x)=\max(0,x)$, A-ReLU is given by $f(x)=\max(V_{ACT}, x)$, where $V_{ACT}$ is a trainable activation voltage at each layer. There is a clear advantage having a programmable activation voltage at each layer. The training of $V_{ACT}$ will provide a coarser threshold for neuron activation and weights in the filter can provide finer training. In digital implementation of ReLU, only weights can train and ReLU threshold is set to 0. The proposed A-ReLU implementation is more akin to a biological neuron firing.

The convolution layer and A-ReLU layer is followed by a Max-Pooling layer which is also be implemented in analog. These stages are followed by another convolution, A-ReLU, Max-Pooling layer. The output from final Max-Pooling layer is used in two ways. Inside the ASIC, it is connected to fully connected (FC) layer of 10 outputs to reduce the memory foot-print. The output of final Max-pooling layer is connected to two FC layers as shown in FIG. 2. In the following sections, we will provide the details of proposed analog-ASIC shown in FIG. 2. The hardware implementation is more general that can accommodate other simpler CNN architectures as well.

Image Acquisition and Quality

The proposed analog-ASIC diverges from a digital design right from the first step of image acquisition, which sets the fundamental limit on the accuracy of all computations that follows. Despite this difference, we aim to maintain similar or better accuracy than digital by acquiring the image at a better SNR than 8-bit digital. Proposed image acquisition doesn't use ADC to convert the pixel voltage into a digital output. We carry out image acquisition in a manner which is more suitable for analog processing.

Figure 3A:
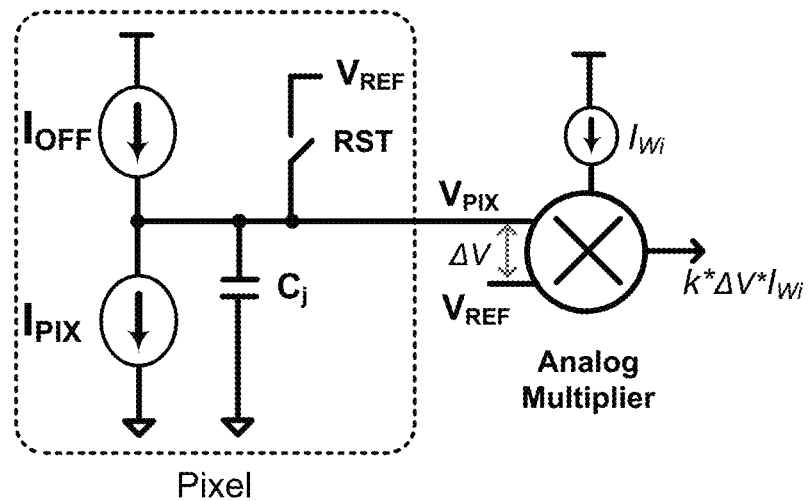
FIG. 3A shows the circuit architecture of a 3-T pixel interfaced with an analog multiplier.
Figure 3B:
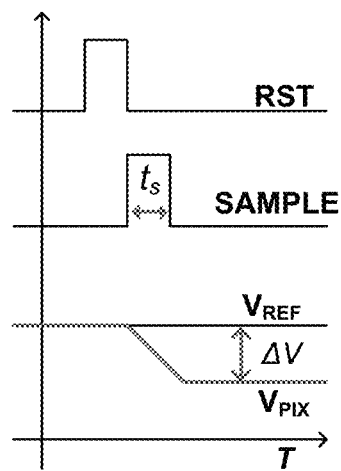
FIG. 3B shows a timing diagram for the circuit of FIG. 3A.

FIG. 3A shows the circuit architecture of a 3-T pixel interfaced with an analog multiplier that follows a design proposed in [50]. A DC offset current, $I_{OFF}$ is subtracted from the photo-current (IPIX) to retain the interesting AC component. This structure can provide up to 150 dB dynamic range [50]. FIG. 3A shows the image acquisition which is similar to correlated double sampling (CDS) technique [51] that has better noise performance. When the pixel is reset, its output is set to $V_{REF}$. After reset is released, the pixel voltage is sampled for a set time $t_S$. The sampled voltage on the capacitor $C_j$ is given $$\Delta V = V_{PIX} - V_{REF} = \frac{(I_{OFF} - I_{PIX})t_s}{C_j},$$

where $I_{PIX}$ is the current from the photo diode and $I_{OFF}$ is used to remove the DC component in the image. The sampling time, $t_S$ can be chosen to be large to realize a large dynamic range output voltage. However, this approach is good for ADC but is not suited for analog computing as it will immediately lead to saturation and non-linearities in the succeeding computing blocks. We will set the value of $C_1$ to approximately 2 pF. The equivalent RMS noise of this capacitor is approximately 32 µV. We will choose a shorter sampling time, $t_S$ to keep the maximum value of $\Delta V$ around 10-20 mV. This will prevent non-linearities in next blocks. Further, shorter sampling time also helps in reducing the power consumption.

If the maximum voltage of $\Delta V$ is 10 mV on a 2 pF cap, then the SNR of the input signal (pixel voltage) is given by 10 mV/32 µV, which is approximately 50 dB. An 8-bit ADC that is limited by quantization noise also has an SNR of 50 dB. Proposed image acquisition circuit acquires similar or better quality images when compared to an 8-bit digital acquisition (commonly used resolution) at lower power and at a faster rate. To illustrate this point, a 100 nA pixel current will take 0.2 µs to charge a 2 pF $C_1$ to 10 mV. But we can sample 100 pixel in parallel for computing (explained later), realizing an effective sampling rate of 0.5 GS/s. A similar sampling rate in digital-processing will require an ADC conversion step consuming 10-100s of mW power for an effective 8-bit conversion [52, 53]. That step, and hence the associated power is completely eliminated in the proposed analog computing platform.

Some of the recent works published at ISSCC makes a case for using 6-bit and 4-bit ADC for vision applications [54, 55]. However, one of the cornerstones of the proposed design is high precision and it is believed that high precision analog computing will also enable various other alternate technologies such as on-chip PDE solvers, reducing the need for process and temperature calibration to reduce test times, among others. In this project, even higher SNR can be realized and then can be traded off with power consumption.

Multiplication Circuit

Figure 4A:
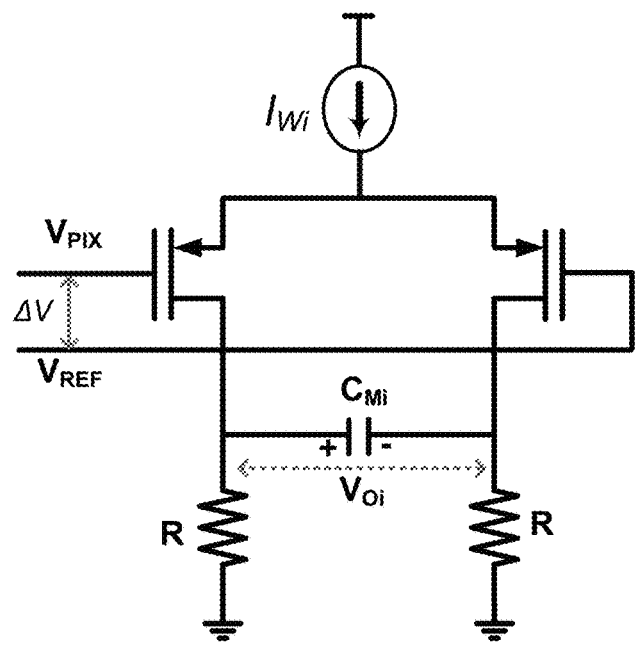
FIG. 4A shows the circuit architecture of an analog multiplier using a diff-amp biased in sub-threshold with a bias current in accordance with one or more embodiments.

FIG. 2A shows a high precision sub-threshold diff-amp circuit for realizing the analog multiplier. FIG. 4A shows the circuit architecture of an analog multiplier using a diff-amp biased in sub-threshold with a bias current $I_{Wi}$. The input signal, $\Delta V$ is directly obtained from the pixel, while the current $I_{Wi}$ is a weight in the convolution filter. The output voltage $V_{Oi}$ is given by, $$V_{Oi} = \Delta V * g_m * R = \frac{I_{Wi}}{\eta V_t} * \Delta V * R \quad (5)$$

Figure 4B:
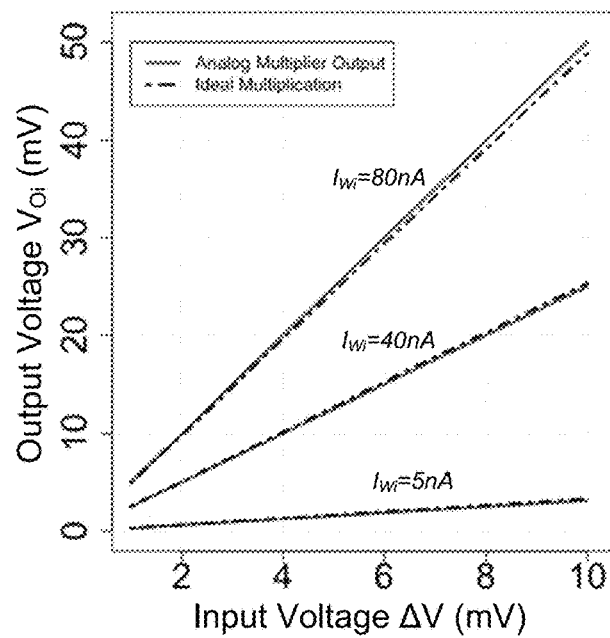
FIG. 4B shows the simulation results of the analog multiplier circuit of FIG. 4A.

The output voltage, $V_{Oi}$ given by equation 5 is a product of pixel voltage and weight for small values of $\Delta V$. We intentionally choose 10 mV of maximum output voltage for the pixcel as diff-amp will quickly become non-linear. FIG. 4B shows the simulation results of the analog multiplier circuit and its comparison with an ideal multiplication in 130 nm CMOS. FIG. 4B shows an almost complete match with a maximum error of ±2% for entire output range. Power Performance Knob: The resistor in the diff-amp is implemented as an SCR, and weights are binary weight of the primary PTAT current. We can maintain the same gain for the diff-amp by increasing switching frequency of the SCR. It increases the value of $I_{Wi}$ and reduces the resistor value by same amount maintaining the same gain. This is used by EMS to scale system performance with power consumption.

The multiplier circuit shown in FIG. 4A is very simple and is implemented using very few transistors. The weight current, $I_{Wi}$ can be implemented as a 4-bit binary weight of the PTAT current reference shown in 2A. The PTV variation of the multiplier can be made very small as detailed below. The training weights for each $I_{Wi}$ is 5-bit, 4-bit binary weights of the PTAT current and one sign bit, which is used in the multiply and accumulate (MAC) circuit discussed below. Weights can be stored in the SRAM. Note that the multiplier is quite compatible with an analog multiplier where weights can be directly entered as analog current, $I_{Wi}$ from the analog memory. However, a complete analog implementation of a CNN, such as in [38] has to address the PTV variation of analog memory or of the associated read-out circuit [56]. Although, CNNs can work with limited accuracy [57], it is still important for practical implementation of a CNN to have very low PTV variation as variations tend to be rather large if not controlled. We will use our precision analog computing platform to have very little PTV variation which has been detailed above.

Multiply and Accumulate (MAC) Unit

Figure 5A:
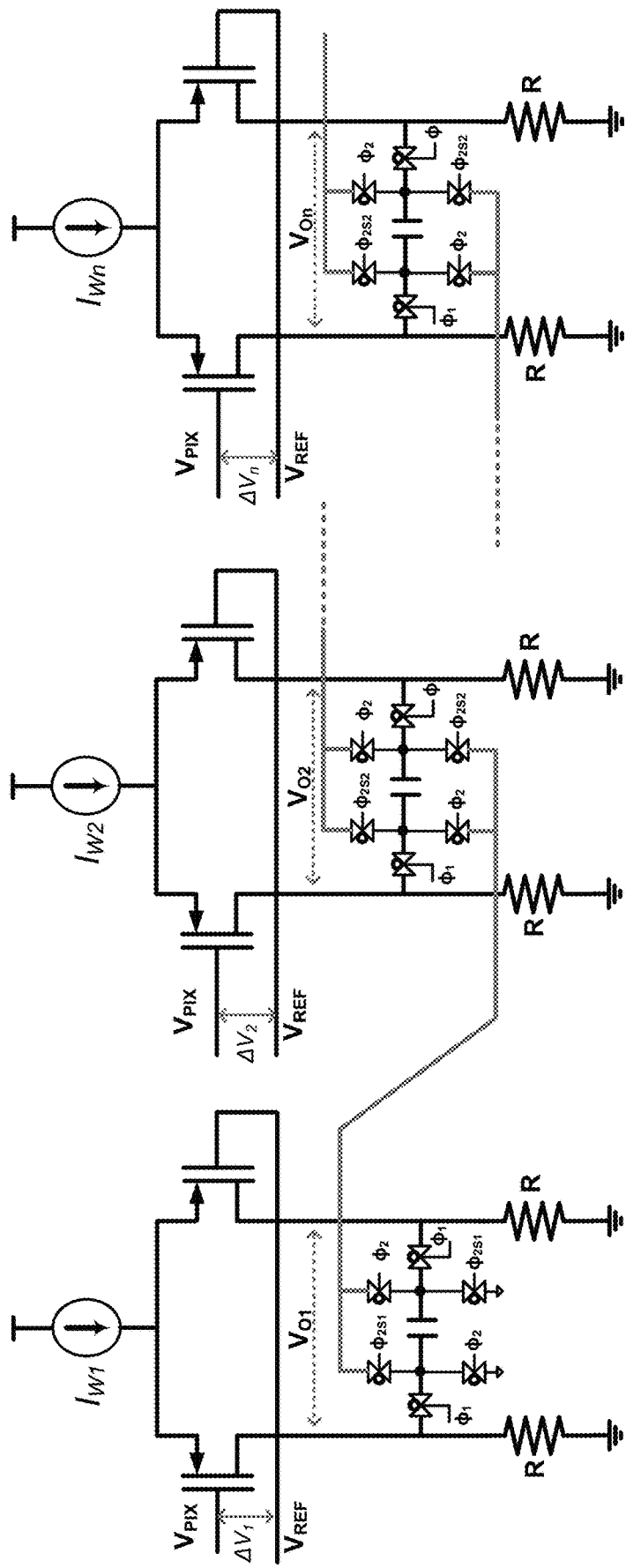
FIG. 5A shows an exemplary multiply and accumulate (MAC) unit in accordance with one or more embodiments.
Figure 5B:
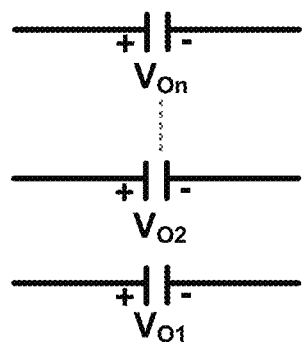
FIGS. 5B and 5C illustrate the voltage output in the first phase and second phase of operation, respectively, of the MAC unit of FIG. 5A.
Figure 5C:
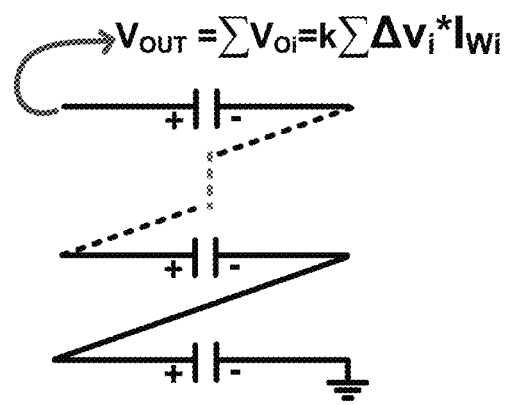

FIG. 5A shows the analog circuit approach used for a MAC unit. The output of each analog multiplication as shown in FIG. 4A is sampled across the capacitor $C_{Mi}$. We configure the circuit for MAC to operate in two phases. In phase $\varphi_1$, all the associated multiplication happens and voltages are sampled across the capacitors. In phase $\varphi_2$, the capacitors are connected in series. The output voltage in phase $\varphi_2$ is given by, $$V_{OUT} = \Sigma V_{Oi} = k * \Sigma(\Delta V_i * I_{Wi}) = \frac{\ln M}{\eta} \frac{C_1}{C_2} \Sigma(\Delta V_i * W_i) \quad (6)$$

$V_{OUT}$ given by equation 6 is sampled on an output capacitor using switching capacitor technique similar to one outlined in an ISSCC paper [58]. $V_{OUT}$ will also have very low PTV variation as the term outside of the summation in equation 6 is a physical constant. Further, the weights can also be negative and is addressed by using a fifth sign bit for the weight. The sign bit will add the capacitor with an inverse configuration. FIG. 5A illustrates this concept. If a sign bit is 0, indicating a negative weight, $\varphi_{2si}$ switch is enabled instead of $\varphi_2$ inversing the polarity of that multiplicand when added in the switched capacitor network.

The maximum gain of the diff-amp in the multiplier is set to 5, meaning gain is 5 when $I_{Wi}$ is maximum. The maximum value of $V_{Oi}$ is equal to 50 mV as shown in FIG. 4B to prevent saturation. In the first stage convolution, 25 MAC operation is carried out for each depth (RGB) of the image. The typical maximum voltage for $V_{OUT}$ will go to ±0.625V, which can be easily handled in a system with a power supply of 1.3V. Further, diff-amp circuits can be prone to mismatch. This effect is mitigated in two ways. First, we use standard analog layout technique such as common-centroid layout of diff-pair to eliminate a significant component of systematic offset. We also employ chopping technique to remove the offset and low-frequency noise from the circuit in a two phase manner similar to [51]. Two-phase chopping (not shown here) will first sample the offset at the output of each amplifier's capacitor while connecting each input to $V_{REF}$ and then subtracting it from the final MAC output.

Alternative Multiplication Circuit and MAC Unit

Figure 8A:
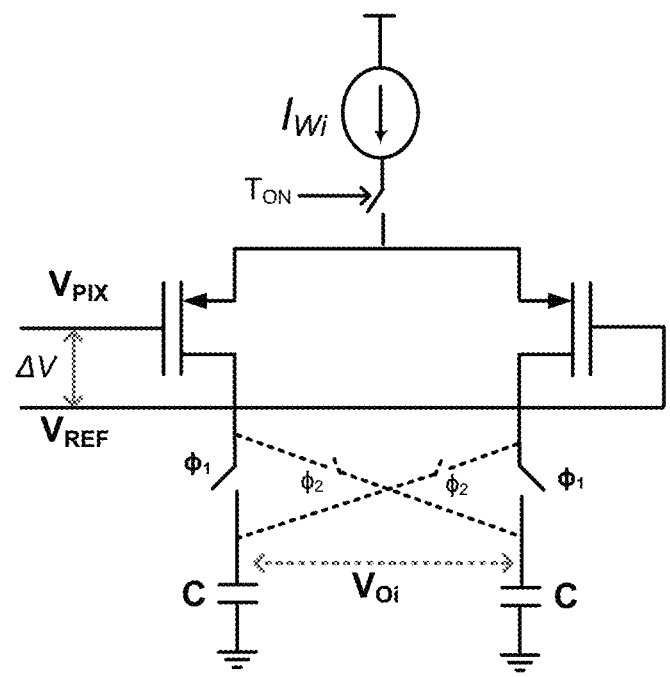
FIG. 8A shows the circuit architecture of an alternate analog multiplier using a diff-amp biased in sub-threshold with a bias current in accordance with one or more embodiments.

FIG. 8A shows the circuit architecture of an alternative analog multiplier embodiment using a differential amplifier biased in sub-threshold with a bias current $I_{Wi}$, and a switching capacitor load. The input signal, ΔV, can be directly obtained from a pixcell, while the current $I_{Wi}$ is the value of the weight in an ML application. The load capacitors are reset to 0 every time a MvM operation is started and the differential amplifier is operated for a fixed time of $T_{ON}$ (provided by a system clock). The output voltage $V_{Oi}$, that is generated by the differential amplifier, and is given by:

$$V_{Oi} = \Delta V \cdot g_m \cdot \frac{T_{ON}}{C} = \frac{I_{Wi}}{\eta V_t} \cdot \Delta V \cdot \frac{T_{ON}}{C} \quad (7)$$

$$V_{Oi} = K \cdot W_i \cdot \Delta V \quad (8)$$

Figure 8B:
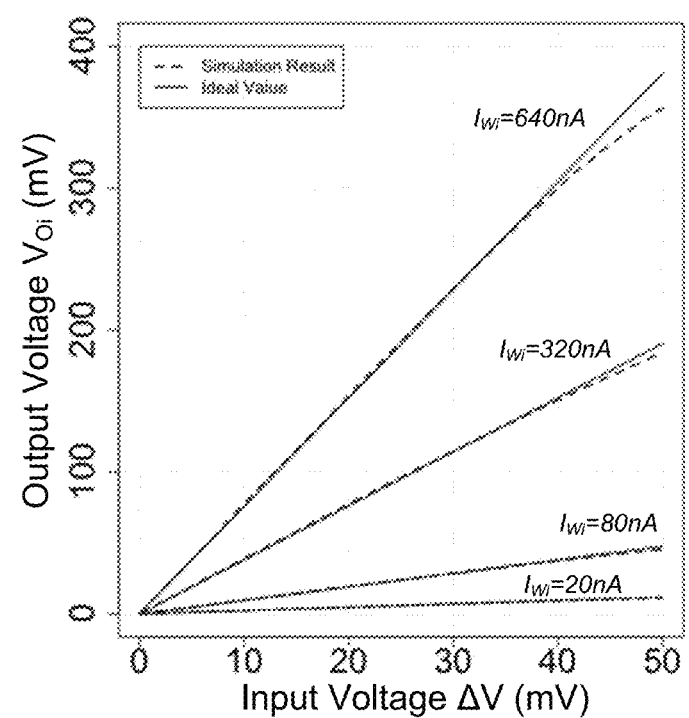
FIG. 8B shows the simulation results of the analog multiplier circuit of FIG. 8A.

$I_{Wi}$ can be generated as a binary weight of the PTAT reference current, which makes K a product of physical constants. The output voltage, $V_{Oi}$, given by equation 8, is the product of the pixcell voltage and the weights for small values of ΔV. This circuit performs linearly for an input voltage ΔV of up to 40 mV. There is some compression for the value of gm, as value of the bias current increases, which we address by adding a compensating current with each binary weight of the current. FIG. 8B shows simulation results of our early design space exploration and compares it with an ideal output of the multiplication. Overall, we achieve a highly linear behavior, with an error of less than 1% in the output value of the multiplication, with ΔV varying from 0-40 mV and a current weight variation of 7-bits for the magnitude and 1-bit for the sign. These values are used in the addition circuit (discussed in below), giving us an 8-bit resolution. Furthermore, the input signal can be adequately represented in 40 mV, with a sufficient noise margin for an 8-bit multiplication. Note that it is not unusual to represent analog signals at lower voltage swings, since it saves power. Our approach is similar to the behavior of neurons, where a signal is represented at 50-100 mV swings. Details on how a 40 mV signal will have an adequate noise margin is discussed below.

Addition/Reduction

Figure 9A:
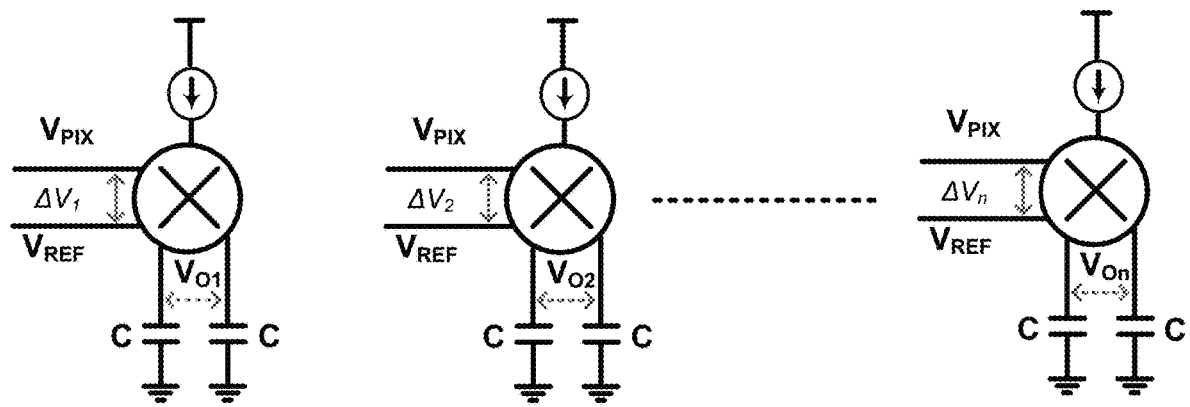
FIG. 9A illustrates exemplary parallel analog multiplication circuits in accordance with one or more embodiments.

Once the multiplication has been performed, we need to add outputs to arrive at the MvM result. FIG. 9A shows the circuit approach used for addition. The output of each analog multiplication, as shown in FIG. 8A, is sampled across the differential capacitors C. We configure the circuit for MvM to operate in two phases. In phase $\varphi_1$, all the associated multiplications are computed and voltages are sampled across the capacitors. In phase $\varphi_3$, the capacitors are connected in parallel to the add. The output voltage in phase $\varphi_3$ is given by, $$V_{NEXT} = \frac{1}{n} \cdot \Sigma V_{Oi} = \frac{1}{n} \cdot \Sigma(\Delta V_i * I_{Wi}) = \frac{\ln M}{n \cdot \eta} \Sigma(\Delta V_i * W_i) \quad (9)$$

Figure 9B:
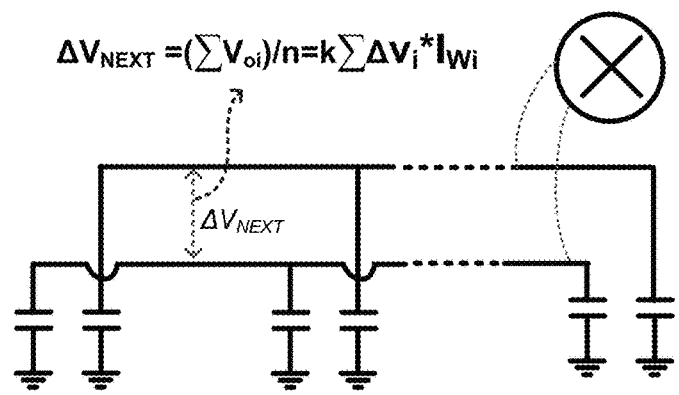
FIG. 9B illustrates an exemplary accumulation circuit in accordance with one or more embodiments.
Figure 10:
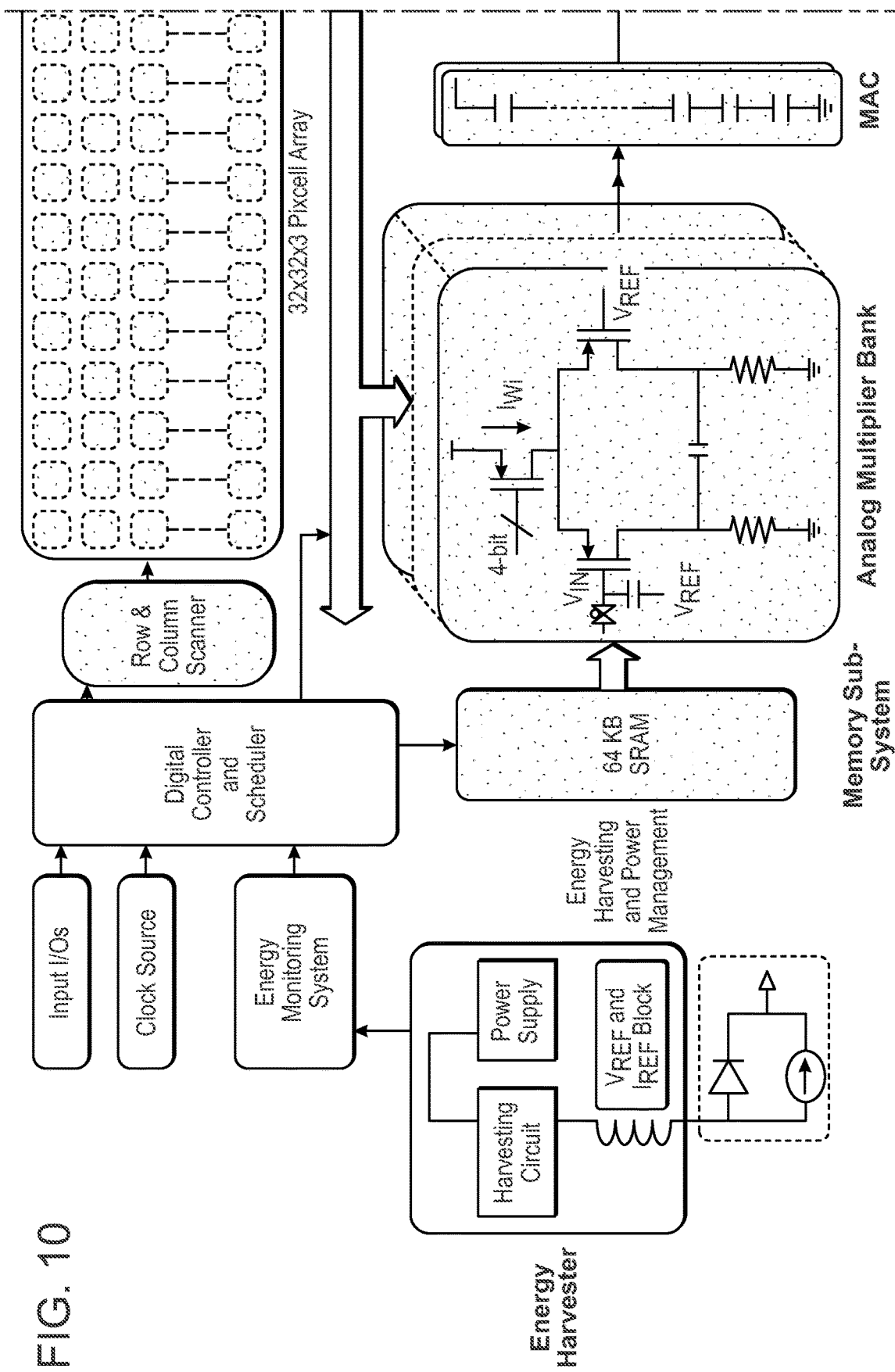
FIG. 10 shows a conceptual architecture of a vision ASIC in accordance with one or more embodiments.
Figure 10:
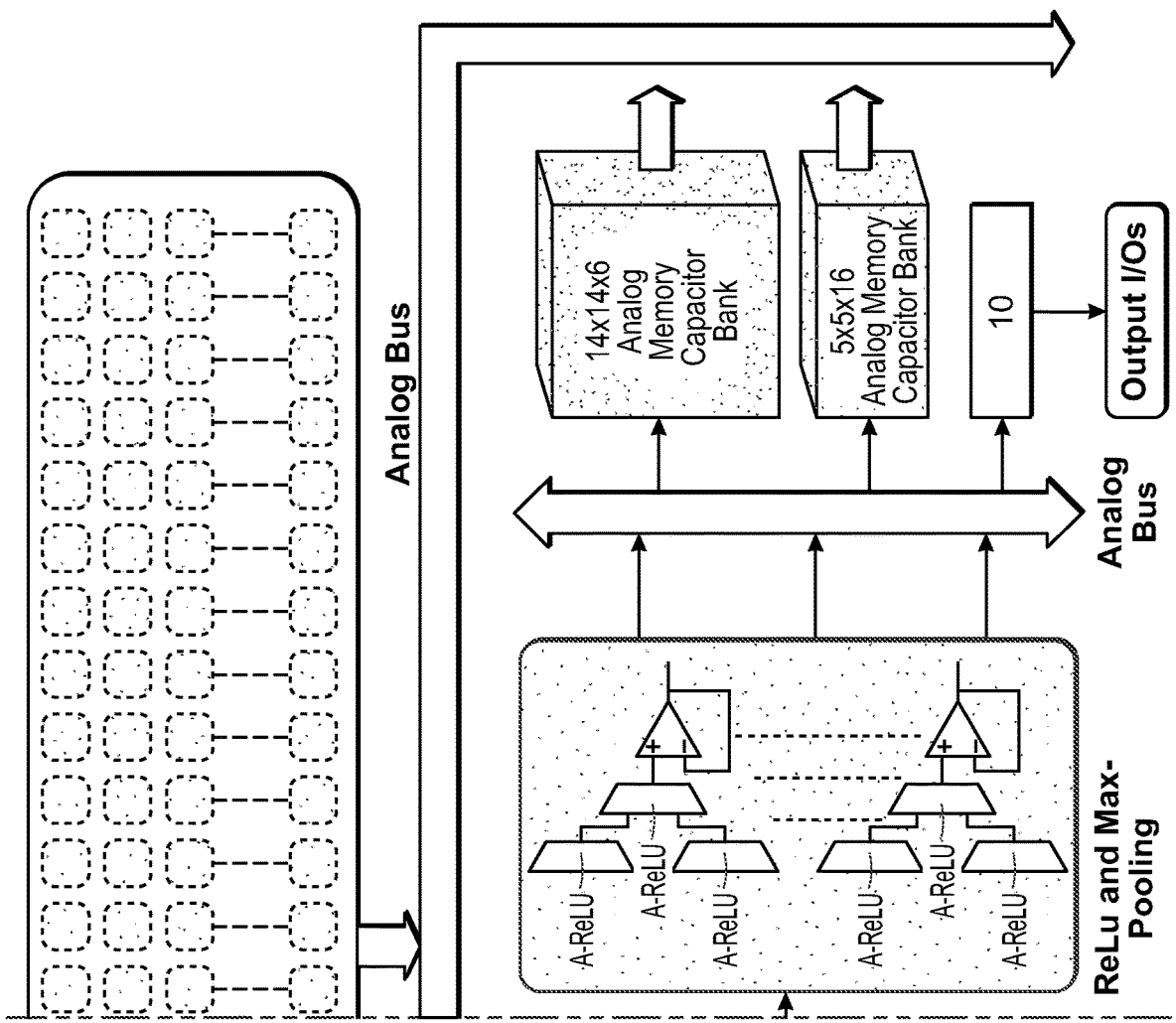

The output voltage $V_{NEXT}$, given by equation 9, is ready to be used by the next layer for multiplication, as shown in FIG. 9B. Additionally, the sign bit (i.e., the eighth bit of the weight) is used to choose the polarity of the addition. In case of a negative output, we can reverse the output capacitors of the multiplier to be added to the network to result in a subtraction of charge.

A-ReLU and Max-Pooling Circuit

Figures 6A, 6B:
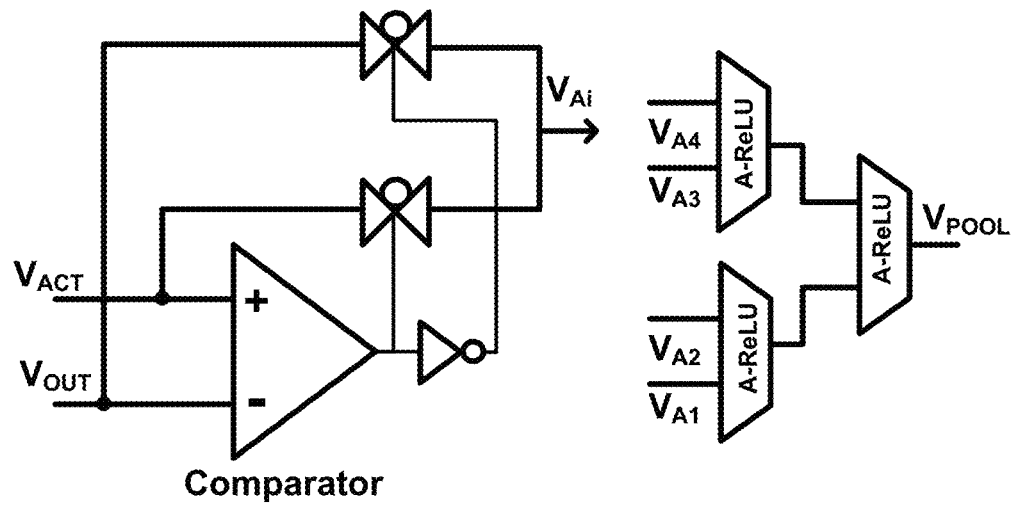
FIG. 6A illustrates an exemplary A-ReLU circuit in accordance with one or more embodiments.
FIG. 6B illustrates an exemplary max-pooling circuit in accordance with one or more embodiments.

The output voltage, $V_{OUT}$ after being sampled is passed through the A-ReLU block. The A-ReLU circuit is simple to realize and is shown in FIG. 6A. $V_{OUT}$ is compared with a trainable activation voltage $V_{ACT}$, using a comparator. The output of the comparator is used to select between $V_{OUT}$ and $V_{ACT}$ which can be sent to the Max-Pooling layer. It realizes the rectifier function $f(x)=\max(V_{ACT}, x)$. The proposed design provides an ability to train $V_{ACT}$ as well, which provides additional training point while conventional ReLU has a fixed threshold of 0. The Max-Pooling circuit is shown in FIG. 6B uses three A-ReLU units. Two pairs of inputs are compared using two A-ReLU units to give the maximum of each pairs. The outputs are then fed to the third layer to give the maximum of the four inputs.

Second-Stage Multiplier and Scaling

Figure 7:
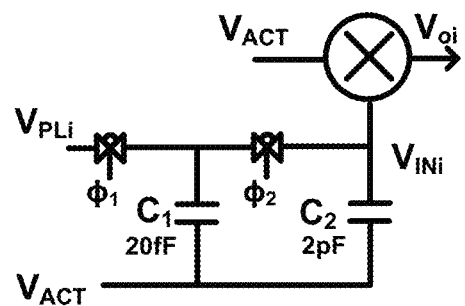
FIG. 7 shows an exemplary voltage scaling circuit using capacitive charge sharing in accordance with one or more embodiments.

The Max-Pooling is again followed by a convolution layer in the proposed CNN. At this stage, we again need to perform MAC operations. The output voltage coming out of Max-Pooling layer is going be a large signal due to the MAC operation which needs to be scaled down to be used with diff-amp multiplier. FIG. 7 shows the voltage scaling circuit using capacitive charge sharing. The pooling voltage that comes out of the Max-Pooling layer is either be equal to or larger than $V_{ACT}$. This differential voltage is first stored on a capacitor of a value of 20 fF in phase $\varphi_1$. In phase $\varphi_2$, this capacitor gets connected in parallel to a 2 pF capacitor having no charge. The resultant capacitor voltage is approximately 100× lower. This voltage can be then fed to the diff-amp multiplier.

The output of the final Max-Pooling layer is handled in two different ways. Inside the ASIC, it gets connected to an FC of 10 outputs. This is done to reduce the memory foot-print needed on-chip. Note that most of the systems store their FCs in DRAM and energy involved in accessing those is significantly large [59]. Each connection inside the FC implemented on the chip will require 400 MAC operation. This operation is carried out in 4 steps, each step performing the first 100 operation. A total of 4000 MAC operations are carried out in this step.

Exemplary ASIC Implementation

The ASIC design considers power, area, physical design, and control flow of the chip. Some of the design aspects are discussed below:

We use 100 differential amplifier in the ASIC which will support 4 parallel MAC operations, as each filter in the convolution layer is 5×5. A total of 210 pF for the MAC network including 100 diff-amps.

Each image pixel has 2 pF output capacitor to meet the noise margin. A total of approximately 150 pF capacitance is needed for sampling 75 image pixel voltages to the Multiplier. Also, capacitive memory holds the value of intermediate matrices. A total 3-4 nF capacitance is needed for the chip.

The design heavily uses capacitors and a total of about 4 nF capacitance are used for the design. An n-MOS capacitor of approximately 10 μm×10 μm gives a capacitance of 1 pF. Scaling that calculation up and placing design margins a 1 mm×1 mm area will sufficiently meet the total capacitance requirement. We use n-MOS caps for decoupling and storing analog voltages, and MIM caps at sensitive computing units such as load resistors and MAC.

A 64 KB on-chip SRAM is used for storing the weights. The size of the ASIC lies between 3 mm×3 mm to 4 mm×4 mm to include all the components of the chip.

Analog multiplication is highest power and will require most bandwidth and takes about 100 μs to at 40 nA average bias. A 100 multiply and 100 addition will take 100 μs. Assuming an average of 40 nA for all multipliers in action, we will have 400 nW for 200 operations resulting in an overall power efficiency of 20

TOPs/W. We estimate that the total power consumption for the chip is less than 2 µW which can be supported through energy harvesting. At this rate ASIC can process 2 frames per-second (fps).

ASIC Architecture and Control

FIG. 9 shows a conceptual architecture of the vision ASIC. The energy monitoring system acts as the primary controller and controls how images are sampled and processed. Vision ASIC includes pixel array, capacitor arrays for analog memory, energy harvesting and power management unit (EHM), 64 KB SRAM, EMS, analog multiplier and computing block, and a real-time clock. The ASIC can be primarily developed for CFAR-10 but can be used in vision application where smaller and targeted classification-set of images exist, such as surveillance. The training and the learning of the ASIC is carried out in a closed set-up inside the lab to learn the weights. In the field application space, vision ASIC can be controlled to operate in the following modes with the estimated power consumption:

Motion Detection Mode: In a motion detection mode, the ASIC compares the current image with the background. It only uses the analog multiplier and MAC unit. The analog multiplier uses a fixed current of 40 nA and performs a 5×5 convolution with a stride of 5 on a 30×30 gray-scale image input. This results in 36 MAC outputs that are compared with previously calculated values. If a change is seen in more than two outputs, it is likely to indicate a motion. Motion detection can be performed every 0.5 s. A total of 900 MAC operations can be used to run it once, which will need 1 ms and consume 1.2 µW for 1 ms. The average power consumption is 3 nW in this case.

Object Detection Mode: Once a motion is detected, the ASIC will start capturing images to extract relevant feature for object recognition or vision. It will operate in the LeNet-5 mode, which is discussed in the previous section, where all weights will be used across each layer. The estimated power consumption in this mode is less than 2 µW while processing at 2-fps.

Video Application: At higher power levels, the ASIC can also target video applications by going in higher performance mode. By increasing the switching frequency of switched-cap network by 8×, bias currents are increased by 8× but ASIC functionality stays the same as multiplier gain is not changed. However, this will increase the performance by 8×, with ASIC processing at 15-fps, reaching the video processing capability.

Energy Monitoring Control Mechanism

In a typical operating mode, the vision ASIC can operate at 2-fps and perform vision tasks after a motion has been detected. This is also an intermediate power consumption mode. If the energy monitoring system identifies that this operating mode cannot meet the predicted lifetime, then it starts scaling down the frame rate and will go down to 0.1-fps. It can also reconfigure stride and filter size used in convolution. A lightweight network with fewer filters and reduced accuracy can also be trained. An increase in stride to 2 in the first convolution filter, use of gray-scale image, and a reduction in the number of filters to 3 in the first stage alone can reduce the power consumption by 12×. For higher performance mode, the switching frequency of switched capacitor network can be increased to realize higher fps.

Having thus described several illustrative embodiments, it is to be appreciated that various alterations, modifications, and improvements will readily occur to those skilled in the art. Such alterations, modifications, and improvements are intended to form a part of this disclosure, and are intended to be within the spirit and scope of this disclosure. While some examples presented herein involve specific combinations of functions or structural elements, it should be understood that those functions and elements may be combined in other ways according to the present disclosure to accomplish the same or different objectives. In particular, acts, elements, and features discussed in connection with one embodiment are not intended to be excluded from similar or other roles in other embodiments. Additionally, elements and components described herein may be further divided into additional components or joined together to form fewer components for performing the same functions.

Accordingly, the foregoing description and attached drawings are by way of example only, and are not intended to be limiting.

REFERENCES

[1] A. Krizhevsky, I. Sutskever, and G. E. Hinton, "Imagenet classification with deep convolutional neural networks," in Advances in Neural Information Processing Systems 25, F. Pereira, C. J. C. Burges, L. Bottou, and K. Q. Weinberger, Eds. Curran Associates, Inc., 2012, pp. 1097-1105. [Online]. Available: http://papers.nips.cc/paper/4824-imagenet-classification-with-deep-convolutional-neural-networks.pdf

[2] M. D. Zeiler and R. Fergus, "Visualizing and understanding convolutional networks," CoRR, vol. abs/1311.2901, 2013. [Online]. Available: http://arxiv.org/abs/1311.2901

[3] K. Simonyan and A. Zisserman, "Very deep convolutional networks for large-scale image recognition," CoRR, vol. abs/1409.1556, 2014. [Online]. Available: http://arxiv.org/abs/1409.1556

[4] C. Szegedy, W. Liu, Y. Jia, P. Sermanet, S. E. Reed, D. Anguelov, D. Erhan, V. Vanhoucke, and A. Rabinovich, "Going deeper with convolutions," CoRR, vol. abs/1409.4842, 2014. [Online]. Available: http://arxiv.org/abs/1409.4842

[5] K. He, X. Zhang, S. Ren, and J. Sun, "Deep residual learning for image recognition," CoRR, vol. abs/1512.03385, 2015. [Online]. Available: http://arxiv.org/abs/1512.03385

[6] R. Girshick, J. Donahue, T. Darrell, and J. Malik, "Rich feature hierarchies for accurate object detection and semantic segmentation," in Proceedings of the 2014 IEEE Conference on Computer Vision and Pattern Recognition, ser. CVPR '14. Washington, D.C., USA: IEEE Computer Society, 2014, pp. 580-587. [Online]. Available: https://doi.org/10.1109/CVPR.2014.81

[7] R. B. Girshick, "Fast R-CNN," CoRR, vol. abs/1504.08083, 2015. [Online]. Available: http://arxiv.org/abs/1504.08083

[8] S. Ren, K. He, R. Girshick, and J. Sun, "Faster r-cnn: Towards real-time object detection with region proposal networks," in Advances in Neural Information Processing Systems 28, C. Cortes, N. D. Lawrence, D. D. Lee, M. Sugiyama, and R. Garnett, Eds. Curran Associates, Inc., 2015, pp. 91-99. [Online]. Available: http://papers.nips.cc/paper/5638-faster-r-cnn-towards-real-time-object-detection-with-region-proposal-networks.pdf

[9] I. Goodfellow, J. Pouget-Abadie, M. Mirza, B. Xu, D. Warde-Farley, S. Ozair, A. Courville, and Y. Bengio, "Generative adversarial nets," in Advances in Neural Information Processing Systems 27, Z. Ghahramani, M. Welling, C. Cortes, N. D. Lawrence, and K. Q. Weinberger, Eds. Curran Associates, Inc., 2014, pp. 2672-2680.

[Online]. Available: http://papers.nips.cc/paper/5423-generative-adversarial-nets.pdf

[10] A. Karpathy and L. Fei-Fei, "Deep visual-semantic alignments for generating image descriptions," IEEE Transactions on Pattern Analysis and Machine Intelligence, vol. 39, no. 4, pp. 664-676, April 2017.

[11] M. Jaderberg, K. Simonyan, A. Zisserman, and k. kavukcuoglu, "Spatial transformer networks," in Advances in Neural Information Processing Systems 28, C. Cortes, N. D. Lawrence, D. D. Lee, M. Sugiyama, and R. Garnett, Eds. Curran Associates, Inc., 2015, pp. 2017-2025. [Online]. Available: http://papers.nips.cc/paper/5854-spatial-transformer-networks.pdf

[12] E. Lindholm, J. Nickolls, S. Oberman, and J. Montrym, "Nvidia tesla: A unified graphics and computing architecture," IEEE Micro, vol. 28, no. 2, pp. 39-55, March 2008.

[13] N. P. Jouppi, C. Young, N. Patil, D. Patterson, G. Agrawal, R. Bajwa, S. Bates, S. Bhatia, N. Boden, A. Borchers, R. Boyle, P. l. Cantin, C. Chao, C. Clark, J. Coriell, M. Daley, M. Dau, J. Dean, B. Gelb, T. V. Ghaemmaghami, R. Gottipati, W. Gulland, R. Hagmann, C. R. Ho, D. Hogberg, J. Hu, R. Hundt, D. Hurt, J. Ibarz, A. Jaffey, A. Jaworski, A. Kaplan, H. Khaitan, D. Killebrew, A. Koch, N. Kumar, S. Lacy, J. Laudon, J. Law, D. Le, C. Leary, Z. Liu, K. Lucke, A. Lundin, G. MacKean, A. Maggiore, M. Mahony, K. Miller, R. Nagarajan, R. Narayanaswami, R. Ni, K. Nix, T. Norrie, M. Omernick, N. Penukonda, A. Phelps, J. Ross, M. Ross, A. Salek, E. Samadiani, C. Severn, G. Sizikov, M. Snelham, J. Souter, D. Steinberg, A. Swing, M. Tan, G. Thorson, B. Tian, H. Toma, E. Tuttle, V. Vasudevan, R. Walter, W. Wang, E. Wilcox, and D. H. Yoon, "In-datacenter performance analysis of a tensor processing unit," in 2017 ACM/IEEE 44th Annual International Symposium on Computer Architecture (ISCA), June 2017, pp. 1-12.

[14] J. L. Hennessy and D. A. Patterson, Computer Architecture, Fifth Edition: A Quantitative Approach, 5th ed. San Francisco, Calif., USA: Morgan Kaufmann Publishers Inc., 2011.

[15] Y. LeCun, "1.1 deep learning hardware: Past, present, and future," in 2019 IEEE International Solid-State Circuits Conference—(ISSCC), February 2019, pp. 12-19.

[16] R. LiKamWa, Y. Hou, Y. Gao, M. Polansky, and L. Zhong, "Redeye: Analog convnet image sensor architecture for continuous mobile vision," in 2016 ACM/IEEE 43rd Annual International Symposium on Computer Architecture (ISCA), June 2016, pp. 255-266.

[17] A. Shafiee, A. Nag, N. Muralimanohar, R. Balasubramonian, J. P. Strachan, M. Hu, R. S. Williams, and V. Srikumar, "Isaac: A convolutional neural network accelerator with in-situ analog arithmetic in crossbars," in 2016 ACM/IEEE 43rd Annual International Symposium on Computer Architecture (ISCA), June 2016, pp. 14-26.

[18] M. C. Potter, B. Wyble, C. E. Hagmann, and E. S. McCourt, "Detecting meaning in rsvp at 13 ms per picture," Attention, Perception, & Psychophysics, vol. 76, no. 2, pp. 270-279, February 2014. [Online]. Available: https://doi.org/10.3758/s13414-013-0605-z

[19] L. Fridman, "Tesla Vehicle Deliveries and Autopilot Mileage Statistics," April 2019.

[20] C. Farabet, C. Poulet, and Y. LeCun, "An fpga-based stream processor for embedded real-time vision with convolutional networks," in 2009 IEEE 12th International Conference on Computer Vision Workshops, ICCV Workshops, September 2009, pp. 878-885.

[21] M. Hahnle, F. Saxen, M. Hisung, U. Brunsmann, and K. Doll, "Fpga-based real-time pedestrian detection on high-resolution images," in The IEEE Conference on Computer Vision and Pattern Recognition (CVPR) Workshops, June 2013.

[22] J. Redmon, S. Divvala, R. Girshick, and A. Farhadi, "You only look once: Unified, real-time object detection," 2016 IEEE Conference on Computer Vision and Pattern Recognition (CVPR), June 2016. [Online]. Available: http://dx.doi.org/10.1109/CVPR.2016.91

[23] R. Huang, J. Pedoeem, and C. Chen, "Yolo-lite: A real-time object detection algorithm optimized for non-gpu computers," 2018 IEEE International Conference on Big Data (Big Data), December 2018. [Online]. Available: http://dx.doi.org/10.1109/BigData.2018.8621865

[24] S.-C. Lin, Y. Zhang, C.-H. Hsu, M. Skach, M. E. Hague, L. Tang, and J. Mars, "The architectural implications of autonomous driving: Constraints and acceleration," SIGPLAN Not., vol. 53, no. 2, pp. 751-766, March 2018. [Online]. Available: http://doi.acm.org/10.1145/3296957.3173191

[25] F. Badin, F. Le Ben, H. Briki, J. Dabadie, M. Petit, S. Magand, and E. Condemine, "Evaluation of evs energy consumption influencing factors, driving conditions, auxiliaries use, driver's aggressiveness," in 2013 World Electric Vehicle Symposium and Exhibition (EVS27), November 2013, pp. 1-12.

[26] Y. Huang, N. Guo, M. Seok, Y. Tsividis, and S. Sethumadhavan, "Evaluation of an analog accelerator for linear algebra," in 2016 ACM/IEEE 43rd Annual International Symposium on Computer Architecture (ISCA), June 2016, pp. 570-582.

[27] Y. Huang, N. Guo, M. Seok, Y. Tsividis, K. Mandli, and S. Sethumadhavan, "Hybrid analog-digital solution of nonlinear partial differential equations," in Proceedings of the 50th Annual IEEE/ACM International Symposium on Microarchitecture, ser. MICRO-50 '17. New York, N.Y., USA: ACM, 2017, pp. 665-678. [Online]. Available: http://doi.acm.org/10.1145/3123939.3124550

[28] IFT-IRDS, "International Roadmap for Devices and Systems: More Moore," https://irds.ieee.org/images/files/pdf/2017.

[29] N. Guo, Y. Huang, T. Mai, S. Patil, C. Cao, M. Seok, S. Sethumadhavan, and Y. Tsividis, "Energy-efficient hybrid analog/digital approximate computation in continuous time," IEEE Journal of Solid-State Circuits, vol. 51, no. 7, pp. 1514-1524, July 2016.

[30] G. E. R. Cowan, R. C. Melville, and Y. P. Tsividis, "A vlsi analog computer/digital computer accelerator," IEEE Journal of Solid-State Circuits, vol. 41, no. 1, pp. 42-53, January 2006.

[31] "A vlsi analog computer/math co-processor for a digital computer," in ISSCC. 2005 IEEE International Digest of Technical Papers. Solid-State Circuits Conference, 2005, February 2005, pp. 82-586 Vol. 1.

[32] D. Miyashita, S. Kousai, T. Suzuki, and J. Deguchi, "A neuromorphic chip optimized for deep learning and cmos technology with time-domain analog and digital mixed-signal processing," IEEE Journal of Solid-State Circuits, vol. 52, no. 10, pp. 2679-2689, October 2017.

[33] L. Lu and R. Vidal, "Combined central and subspace clustering for computer vision applications," in Proceedings of the 23rd International Conference on Machine Learning, ser. ICML '06. New York, N.Y., USA: ACM, 2006, pp. 593-600. [Online]. Available: http://doi.acm.org/10.1145/1143844.1143919

[34] J. Park, I. Hong, G. Kim, Y. Kim, K. Lee, S. Park, K. Bong, and H. J. Yoo, "A 646 gops/w multi-classifier many-core processor with cortex-like architecture for super-resolution recognition," in 2013 IEEE International Solid-State Circuits Conference Digest of Technical Papers, February 2013, pp. 168-169.

[35] D. Bankman, L. Yang, B. Moons, M. Verhelst, and B. Murmann, "An always-on 3.8 mj/86% cifar-10 mixed-signal binary cnn processor with all memory on chip in 28 nm cmos," in 2018 IEEE International Solid-State Circuits Conference—(ISSCC), February 2018, pp. 222-224.

[36] S. Ambrogio, P. Naraynan, H. Tsai, R. M. Shelby, I. Boybat, C. d. Nolfo, S. Sidler, M. Giordano, M. Bodini, N. C. P. Farinha, B. Killen, C. Cheng, Y. Jaoudi, and G. W. Burr, "Equivalent-accuracy accelerated neural-network training using analogue memory," Nature, vol. 558, pp. 60-67, June 2018. [Online]. Available: https://doi.org/10.1038/s41586-018-0180-5

[37] S. Ambrogio, P. Narayanan, H. Tsai, R. M. Shelby, I. Boybat, C. di Nolfo, S. Sidler, M. Giordano, M. Bodini, N. C. P. Farinha, B. Killeen, C. Cheng, Y. Jaoudi, and G. W. Burr, "Equivalent-accuracy accelerated neural-network training using analogue memory," Nature, vol. 558, no. 7708, pp. 60-67, 2018. [Online]. Available: https://doi.org/10.1038/s41586-018-0180-5

[38] H. W. Wu, P. Yao, B. Gao, and H. Qian, "Multiplication on the edge," Nature Electronics, vol. 1, pp. 8-9, January 2018. [Online]. Available: https://www.nature.com/articles/s41928-017-0011-y

[39] C. Li, M. Hu, Y. Li, H. Jiang, N. Ge, E. Montgomery, J. Zhang, W. Song, N. Davila, C. E. Graves, Z. Li, J. P. Strachan, P. Lin, Z. Wang, M. Barnell, Q. Wu, R. S. W. Williams, J. J. Yang, and Q. Xia, "Analogue signal and image processing with large memristor crossbars," Nature Electronics, vol. 1, pp. 52-59, December 2017. [Online]. Available: https://www.nature.com/articles/s41928-017-0002-z

[40] D. B. Strukov, G. S. Snider, D. R. Stewart, and R. S. Williams, "The missing memristor found," Nature, vol. 453, pp. 80 EP—, May 2008. [Online]. Available: https://doi.org/10.1038/nature06932

[41] H. Manem and G. S. Rose, "A read-monitored write circuit for 1t1m multi-level memristor memories," in 2011 IEEE International Symposium of Circuits and Systems (ISCAS), May 2011, pp. 2938-2941.

[42] K. Beckmann, J. Holt, H. Manem, J. Van Nostrand, and N. C. Cady, "Nanoscale hafnium oxide rram devices exhibit pulse dependent behavior and multi-level resistance capability," MRS Advances, vol. 1, no. 49, p. 3355-3360, 2016.

[43] W. He, H. Sun, Y. Zhou, K. Lu, K. Xue, and X. Miao, "Customized binary and multi-level hfo2x-based memristors tuned by oxidation conditions," Scientific Reports, vol. 7, no. 1, p. 10070, 2017. [Online]. Available: https://doi.org/10.1038/s41598-017-09413-9

[44] N. H. El-Hassan, N. T. Kumar, and H. A. F. Almurib, "Modelling of wire resistance effect in pcm-based nano-crossbar memory," The Journal of Engineering, vol. 2016, no. 10, pp. 357-362, 2016.

[45] B. H. Calhoun, A. Wang, and A. Chandrakasan, "Modeling and sizing for minimum energy operation in sub-threshold circuits," IEEE Journal of Solid-State Circuits, vol. 40, no. 9, pp. 1778-1786, September 2005.

[46] R. G. Dreslinski, M. Wieckowski, D. Blaauw, D. Sylvester, and T. Mudge, "Near-threshold computing: Reclaiming moore's law through energy efficient integrated circuits," Proceedings of the IEEE, vol. 98, no. 2, pp. 253-266, February 2010.

[47] N. Mirchandani and A. Shrivastava, "High stability gain structure and filter realization with less than 50 ppm/oc temperature variation with ultra-low power consumption using switched-capacitor and sub-threshold biasing," in 2018 IEEE International Symposium on Circuits and Systems (ISCAS), May 2018, pp. 1-4.

[48] N. Binkert, B. Beckmann, G. Black, S. K. Reinhardt, A. Saidi, A. Basu, J. Hestness, D. R. Hower, T. Krishna, S. Sardashti, R. Sen, K. Sewell, M. Shoaib, N. Vaish, M. D. Hill, and D. A. Wood, "The gem5 simulator," SIGARCH Comput. Archit. News, vol. 39, no. 2, pp. 1-7, August 2011. [Online]. Available: http://doi.acm.org/10.1145/2024716.2024718

[49] C. C. Enz and G. C. Temes, "Circuit techniques for reducing the effects of op-amp imperfections: autozeroing, correlated double sampling, and chopper stabilization," Proceedings of the IEEE, vol. 84, no. 11, pp. 1584-1614, November 1996.

[50] Xiongfei Yu, Chunxiang Zhu, Hang Hu, A. Chin, M. F. Li, Byung Jin Cho, Dim-Lee Kwong, P. D. Foo, and Ming Bin Yu, "A high-density mim capacitor (13 ff/m2) using ald hfo2dielectrics," IEEE Electron Device Letters, vol. 24, no. 2, pp. 63-65, February 2003.

[51] N. Mirchandani and A. Shrivastava, "CMOS based ultra-low power high-precision analog vector matrix multiplication circuit with 0.1% error for vision application," in 2019 IEEE Midwest Symposium on Circuits and Systems (MWSCAS), August 2019, pp. 1-4.

[52] H. P. Ng, S. H. Ong, K. W. C. Foong, P. S. Goh, and W. L. Nowinski, "Medical image segmentation using k-means clustering and improved watershed algorithm," in 2006 IEEE Southwest Symposium on Image Analysis and Interpretation, March 2006, pp. 61-65.

[53] D. Chen, S. L. Sain, and K. Guo, "Data mining for the online retail industry: A case study of rfm model-based customer segmentation using data mining," Journal of Database Marketing & Customer Strategy Management, vol. 19, no. 3, pp. 197-208, September 2012. [Online]. Available: https://doi.org/10.1057/dbm.2012.17

[54] J. Lu, S. Young, I. Arel, and J. Holleman, "A 1 tops/w analog deep machine-learning engine with floating-gate storage in 0.13 m cmos," IEEE Journal of Solid-State Circuits, vol. 50, no. 1, pp. 270-281, January 2015.

[55] G. Serrano and P. Hasler, "A precision low-tc wide-range cmos current reference," IEEE Journal of Solid-State Circuits, vol. 43, no. 2, pp. 558-565, February 2008.

[56] 0. Vietze and P. Seitz, "Image sensing with programmable offset pixels for increased dynamic range of more than 150 db," Proc. of SPIE, vol. 2654, pp. 2654-2654-6, 1996.

[Online]. Available: https://doi.org/10.1117/12.236088

[57] J. Zhang, Z. Wang, and N. Verma, "18.4 a matrix-multiplying adc implementing a machine-learning classifier directly with data conversion," in 2015 IEEE International Solid-State Circuits Conference—(ISSCC) Digest of Technical Papers, February 2015, pp. 1-3.

[58] E. H. Lee and S. S. Wong, "24.2 a 2.5 ghz 7.7 tops/w switched-capacitor matrix multiplier with co-designed local memory in 40 nm," in 2016 IEEE International Solid-State Circuits Conference (ISSCC), January 2016, pp. 418-419.

[59] M. Courbariaux, Y. Bengio, and J.-P. David, "Binary-connect: Training deep neural networks with binary weights during propagations," in Advances in Neural Information Processing Systems 28, C. Cortes, N. D.

Lawrence, D. D. Lee, M. Sugiyama, and R. Garnett, Eds. Curran Associates, Inc., 2015, pp. 3123-3131. [Online]. Available: http://papers.nips.cc/paper/5647-binaryconnect-training-deep-neural-networks-with-binary-weights-during-propagations.pdf

[60] E. H. Lee and S. S. Wong, "Analysis and design of a passive switched-capacitor matrix multiplier for approximate computing," IEEE Journal of Solid-State Circuits, vol. 52, no. 1, pp. 261-271, January 2017.

[61] M. Bojarski, D. D. Testa, D. Dworakowski, B. Firner, B. Flepp, P. Goyal, L. D. Jackel, M. Monfort, U. Muller, J. Zhang, X. Zhang, J. Zhao, and K. Zieba, "End to end learning for self-driving cars," 2016.

[62] A. Shrivastava, J. Lach, and B. Calhoun, "A charge pump based receiver circuit for voltage scaled interconnect," in Proceedings of the 2012 ACM/IEEE International Symposium on Low Power Electronics and Design, ser. ISLPED '12. New York, N.Y., USA: ACM, 2012, pp. 327-332. [Online]. Available: http://doi.acm.org/10.1145/2333660.2333733

[63] Y. S. Shao, S. L. Xi, V. Srinivasan, G. Wei, and D. Brooks, "Co-designing accelerators and soc interfaces using gem5-aladdin," in 2016 49th Annual IEEE/ACM International Symposium on Microarchitecture (MICRO), October 2016, pp. 1-12.

[64] T. Nikolaos, K. Georgopoulos, and Y. Papaefstathiou, "A novel way to efficiently simulate complex full systems incorporating hardware accelerators," in Proceedings of the Conference on Design, Automation & Test in Europe, ser. DATE '17. 3001 Leuven, Belgium, Belgium: European Design and Automation Association, 2017, pp. 658-661. [Online]. Available: http://dLacm.org/citation.cfm?id=3130379.3130538

[65] J. Cong, Z. Fang, M. Gill, and G. Reinman, "Parade: A cycle-accurate full-system simulation platform for accelerator-rich architectural design and exploration," in 2015 IEEE/ACM International Conference on Computer-Aided Design (ICCAD), November 2015, pp. 380-387.

[66] A. Shrivastava, D. A. Kamakshi, and B. H. Calhoun, "A 1.5 nw, 32.768 khz xtal oscillator operational from a 0.3 v supply," IEEE Journal of Solid-State Circuits, vol. 51, no. 3, pp. 686-696, March 2016.

[67] A. Shrivastava, K. Craig, N. E. Roberts, D. D. Wentzloff, and B. H. Calhoun, "5.4 a 32 nw bandgap reference voltage operational from 0.5 v supply for ultra-low power systems," in 2015 IEEE International Solid-State Circuits Conference—(ISSCC) Digest of Technical Papers, February 2015, pp. 1-3.

[68] A. Shrivastava, D. Wentzloff, and B. H. Calhoun, "A 10 mv-input boost converter with inductor peak current control and zero detection for thermoelectric energy harvesting," in Proceedings of the IEEE 2014 Custom Integrated Circuits Conference, September 2014, pp. 1-4.

[69] N. E. Roberts, K. Craig, A. Shrivastava, S. N. Wooters, Y. Shakhsheer, B. H. Calhoun, and D. D. Wentzloff, "26.8 a 236 nw −56.5 dbm-sensitivity bluetooth low-energy wakeup receiver with energy harvesting in 65 nm cmos," in 2016 IEEE International Solid-State Circuits Conference (ISSCC), January 2016, pp. 450-451.

[70] Y. Zhang, F. Zhang, Y. Shakhsheer, J. D. Silver, A. Klinefelter, M. Nagaraju, J. Boley, J. Pandey, A. Shrivastava, E. J. Carlson, A. Wood, B. H. Calhoun, and B. P. Otis, "A batteryless 19 mw mics/ism-band energy harvesting body sensor node soc for exg applications," IEEE Journal of Solid-State Circuits, vol. 48, no. 1, pp. 199-213, January 2013.

[71] A. Klinefelter, N. E. Roberts, Y. Shakhsheer, P. Gonzalez, A. Shrivastava, A. Roy, K. Craig, M. Faisal, J. Boley, S. Oh, Y. Zhang, D. Akella, D. D. Wentzloff, and B. H. Calhoun, "A 6.45 mw self-powered iot soc with integrated energy-harvesting power management and ulp asymmetric radios," in 2015 IEEE International Solid-State Circuits Conference—(ISSCC) Digest of Technical Papers, February 2015, pp. 1-3.

[72] "NSF Industry-University Cooperation Center—Center for Hardware and Embedded Systems Security and Trust (CHEST)," https://nsfchest.org.

[73] S. Abdelfattah, A. Shrivastava, and M. Onabajo, "A chopper instrumentation amplifier with fully symmetric negative capacitance generation feedback loop and online digital calibration for input impedance boosting," in 2019 IEEE Midwest Symposium on Circuits and Systems (MWSCAS), August 2019, pp. 1-4.

The invention claimed is:

1. An analog computing method, comprising:
(a) generating a biasing current ($I_{in}$) using a constant gm bias circuit operating in a subthreshold region for ultra-low power consumption, wherein gm is generated by PMOS or NMOS transistors, said circuit including a switched capacitor resistor; and
(b) multiplying the biasing current by an input voltage using a differential amplifier multiplication circuit to generate an analog voltage output ($V_{Oi}$), wherein the differential amplifier multiplication circuit comprises a pair of transistors coupled at their sources for receiving the biasing current, wherein the input voltage is applied to the gates of the transistors, and wherein (i) the drains of the transistors are coupled to a capacitor across which the analog voltage output of the amplifier multiplication circuit is sampled or (ii) the drains of the transistors are each coupled to a load capacitor and the analog voltage output of the amplifier multiplication circuit is sampled across the drains.

2. The method of claim 1, wherein method is used in a vision application, and wherein the biasing current represents a weight in a convolution filter, and the input voltage represents a pixel voltage of an acquired image.

3. The method of claim 2, wherein the vision application comprises image classification using a convolutional neural network (CNN).

4. The method of claim 1, further comprising, in a second phase, adding the analog voltage output to an analog voltage output of each of a plurality of additional analog differential amplifier multiplication circuits in a multiply and accumulate unit to generate a voltage output for the multiply and accumulate unit.

5. The method of claim 4, further comprising comparing the voltage output of the multiply and accumulate unit with a trainable activation voltage using a comparator.

6. The method of claim 5, wherein the steps of the method are implemented in an application-specific integrated circuit (ASIC).

7. An analog computing circuit, comprising:
a constant gm bias circuit operating in a subthreshold region for ultra-low power consumption for generating a biasing current ($I_{in}$), wherein gm in the constant gm bias circuit is generated by PMOS or NMOS transistors, said constant gm bias circuit including a switched capacitor resistor; and
a differential amplifier multiplication circuit coupled to the constant gm bias circuit for receiving the biasing current and an input voltage and multiplying the biasing current by the input voltage to generate an analog voltage output ($V_{Oi}$), wherein the differential amplifier multiplication circuit comprises a pair of transistors coupled at their sources for receiving the biasing current, wherein the input voltage is applied to the gates of the transistors, and wherein (i) the drains of the transistors are coupled to a capacitor across which the analog voltage output of the amplifier multiplication circuit is sampled or (ii) the drains of the transistors are each coupled to a load capacitor and the analog voltage output of the amplifier multiplication circuit is sampled across the drains.

8. The analog computing circuit of claim 7, wherein the analog computing circuit is used in a vision application, and wherein the biasing current represents a weight in a convolution filter, and the input voltage represents a pixel voltage of an acquired image.

9. The analog computing circuit of claim 8, wherein the vision application comprises image classification using a convolutional neural network (CNN).

10. The analog computing circuit of claim 7, further comprising a multiply and accumulate unit for adding the analog voltage output to an analog voltage output of each of a plurality of additional analog differential amplifier multiplication circuits in a second phase to generate a voltage output for the multiply and accumulate unit.

11. The analog computing circuit of claim 10, further comprising a comparator for comparing the voltage output of the multiply and accumulate unit with a trainable activation voltage.

12. The analog computing circuit of claim 11, wherein the analog computing circuit is implemented in an application-specific integrated circuit (ASIC).

\* \* \* \* \*